(12) United States Patent
Joei et al.

(10) Patent No.: US 11,127,910 B2
(45) Date of Patent: Sep. 21, 2021

(54) IMAGING DEVICE AND ELECTRONIC APPARATUS

(71) Applicant: SONY CORPORATION, Tokyo (JP)

(72) Inventors: Masahiro Joei, Kanagawa (JP); Shigehiro Ikehara, Kanagawa (JP); Shuji Manda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 337 days.

(21) Appl. No.: 16/088,071

(22) PCT Filed: Feb. 15, 2017

(86) PCT No.: PCT/JP2017/005512
§ 371 (c)(1),
(2) Date: Sep. 24, 2018

(87) PCT Pub. No.: WO2017/169231
PCT Pub. Date: Oct. 5, 2017

(65) Prior Publication Data
US 2020/0303666 A1   Sep. 24, 2020

(30) Foreign Application Priority Data

Mar. 31, 2016   (JP) .............................. JP2016-071152

(51) Int. Cl.
*H01L 51/44* (2006.01)
*H04N 5/369* (2011.01)
(Continued)

(52) U.S. Cl.
CPC .......... *H01L 51/448* (2013.01); *H01L 27/286* (2013.01); *H01L 27/307* (2013.01); *H04N 5/379* (2018.08)

(58) Field of Classification Search
CPC ......... H01L 27/17; H01L 27/30; H01L 27/14; H01L 51/448; H01L 27/307; H01L 27/286

See application file for complete search history.

(56) References Cited

U.S. PATENT DOCUMENTS 8,766,340 B2   7/2014   Toyoda
2006/0170069 A1   8/2006   Kim
(Continued)

FOREIGN PATENT DOCUMENTS

CN   101425525 A   5/2009
CN   104465680 A   3/2015
(Continued)

OTHER PUBLICATIONS

International Search Report and Written Opinion of PCT Application No. PCT/JP2017/005512, dated Apr. 11, 2017, 10 pages of ISRWO.

*Primary Examiner* — Dung A. Le
(74) *Attorney, Agent, or Firm* — Chip Law Group

(57) ABSTRACT

An imaging device according to the disclosure includes: a semiconductor substrate including an effective pixel region in which a plurality of pixels are disposed, and a peripheral region provided around the effective pixel region; an organic photoelectric conversion layer provided on side of the semiconductor substrate on which a light receiving surface is disposed; a first sealing layer provided on the semiconductor substrate; a recess provided in the first sealing layer on the effective pixel region; and a light shielding film provided on the first sealing layer on the peripheral region.

16 Claims, 12 Drawing Sheets

(51) Int. Cl.
*H01L 27/28* (2006.01)
*H01L 27/30* (2006.01)

(56) References Cited

U.S. PATENT DOCUMENTS

| | | |
|---|---|---|
| 2008/0035965 A1 | 2/2008 | Hayashi et al. |
| 2008/0169524 A1 | 7/2008 | Kim |
| 2008/0237766 A1 | 10/2008 | Kim |
| 2009/0108388 A1 | 4/2009 | Otsuka et al. |
| 2009/0108389 A1 | 4/2009 | Inoue |
| 2009/0251573 A1 | 10/2009 | Toyoda |
| 2011/0248368 A1 | 10/2011 | Otsuka et al. |
| 2013/0015435 A1* | 1/2013 | Sawaki ............... H01L 51/4253 257/40 |
| 2014/0239156 A1 | 8/2014 | Hayashi et al. |
| 2015/0076646 A1 | 3/2015 | Hsu et al. |
| 2015/0091121 A1* | 4/2015 | Manda .............. H01L 27/14621 257/443 |
| 2015/0102448 A1* | 4/2015 | Sato .................. H01L 27/14634 257/446 |
| 2015/0194469 A1* | 7/2015 | Joei ................... H01L 27/14647 257/40 |
| 2016/0035767 A1 | 2/2016 | Matsuda et al. |

FOREIGN PATENT DOCUMENTS

| | | |
|---|---|---|
| JP | 5-29598 A | 2/1993 |
| JP | 2000-150846 A | 5/2000 |
| JP | 2005-209677 A | 8/2005 |
| JP | 2008-72090 A | 3/2008 |
| JP | 2009-099626 A | 5/2009 |
| JP | 2009-111059 A | 5/2009 |
| JP | 2009-252949 A | 10/2009 |
| JP | 2012-19235 A | 1/2012 |
| JP | 2016-033977 A | 3/2016 |
| KR | 10-2006-0088631 A | 8/2006 |
| KR | 10-2015-0031208 A | 3/2015 |
| TW | 200919714 A | 5/2009 |

* cited by examiner

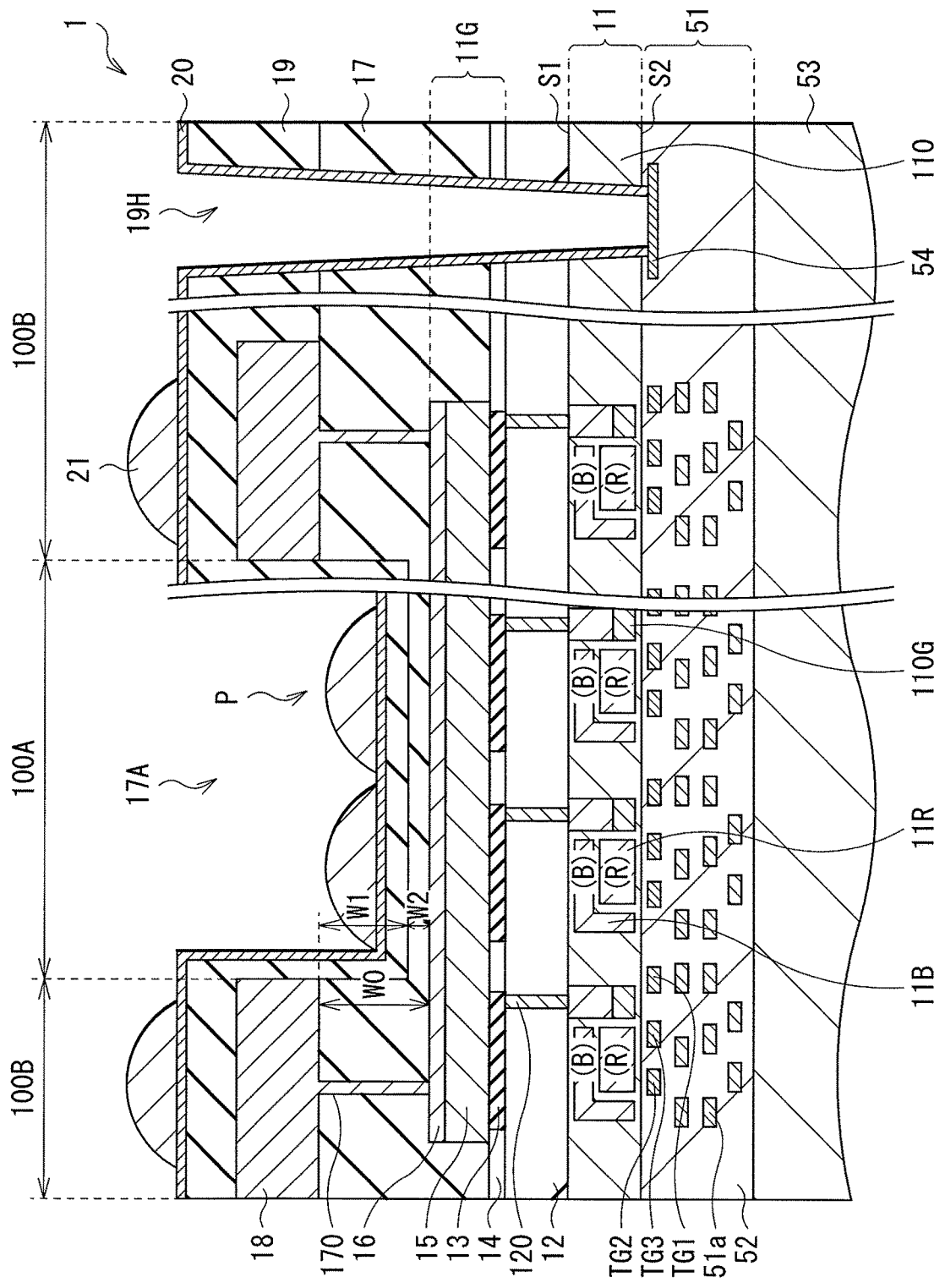
[FIG.1]

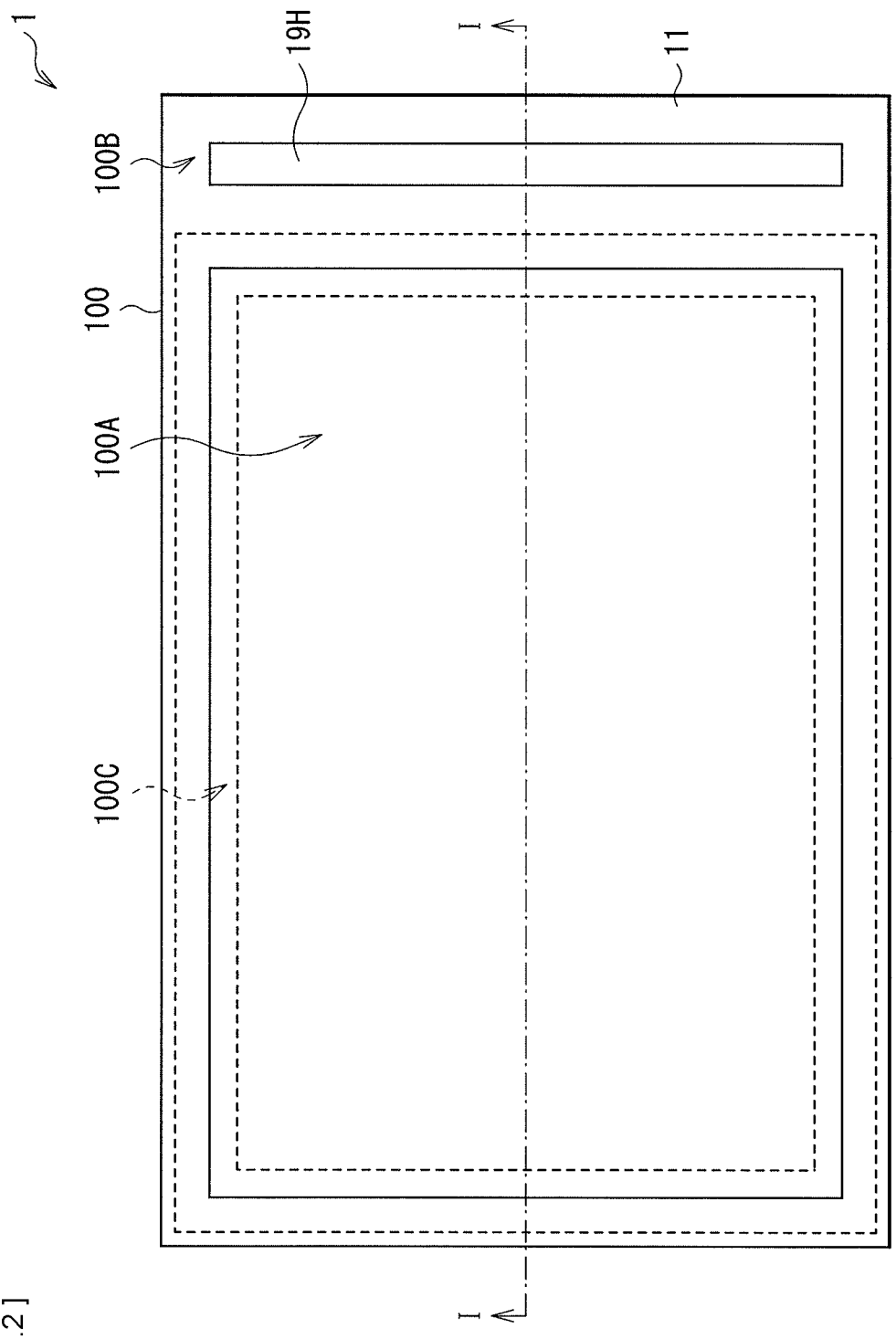
[FIG.2]

[ FIG. 3A ]
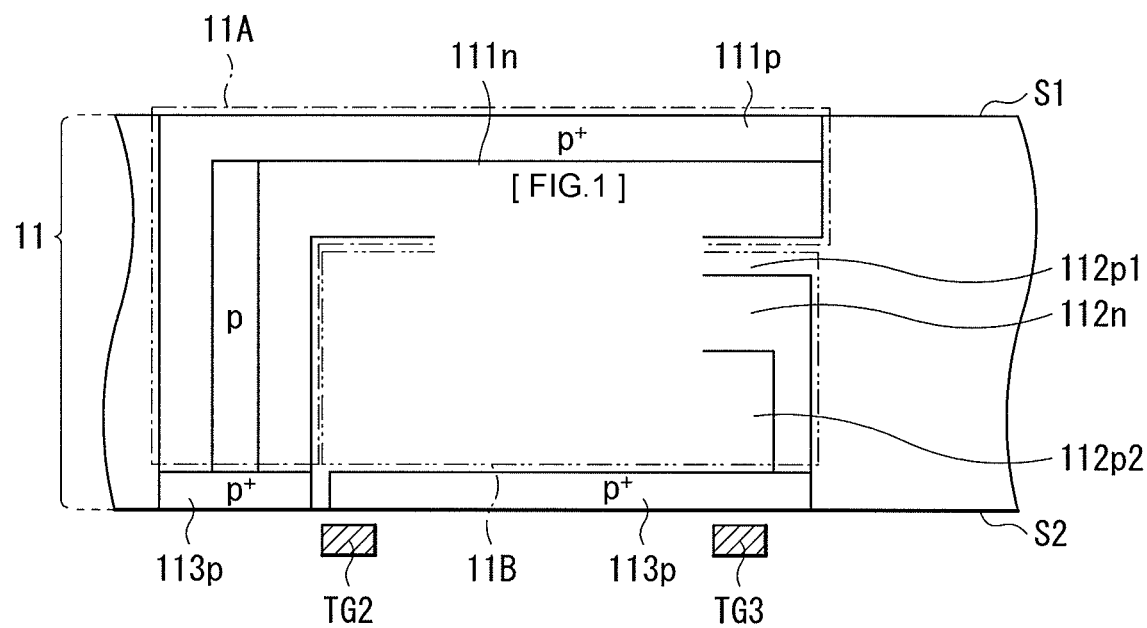
[ FIG. 3B ]
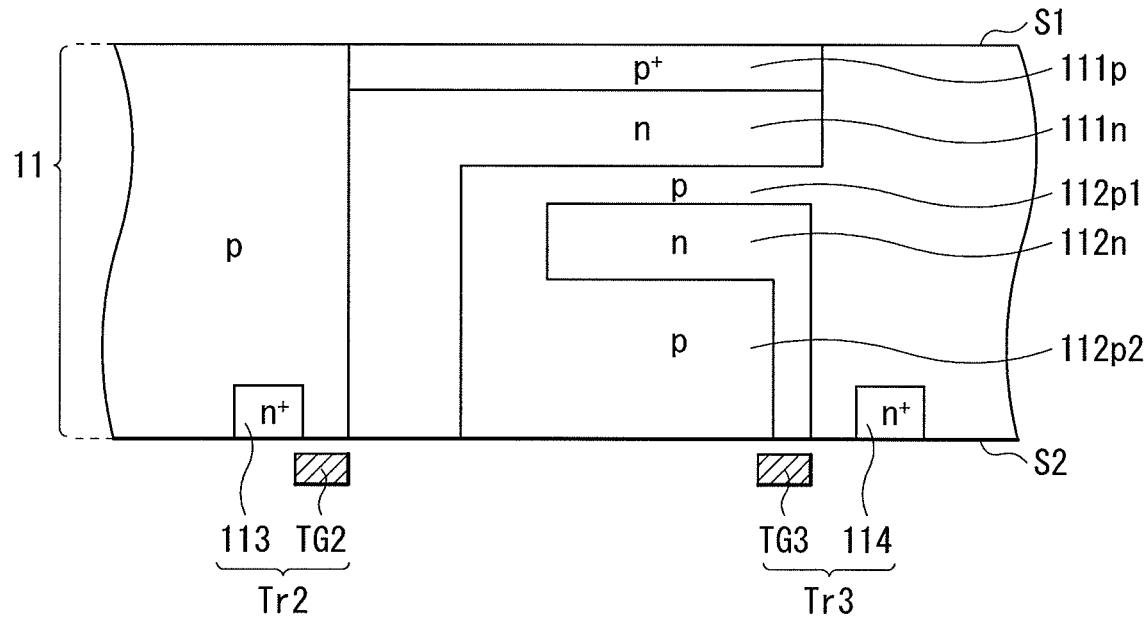

[ FIG. 4 ]
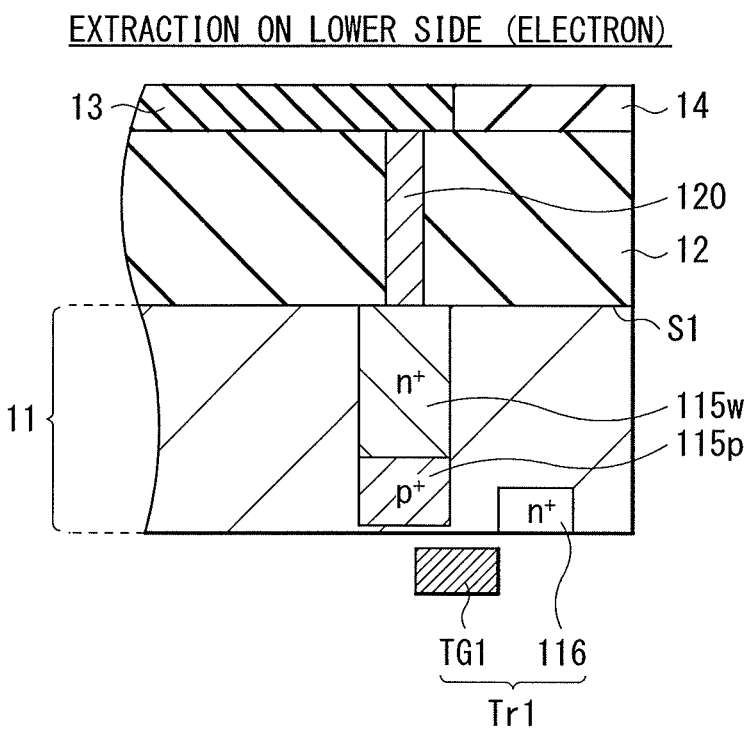
[ FIG. 5 ]
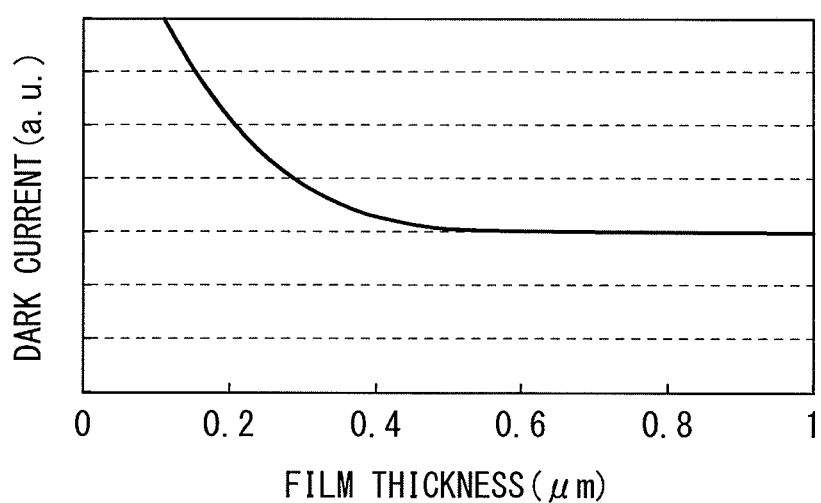

[FIG. 6]
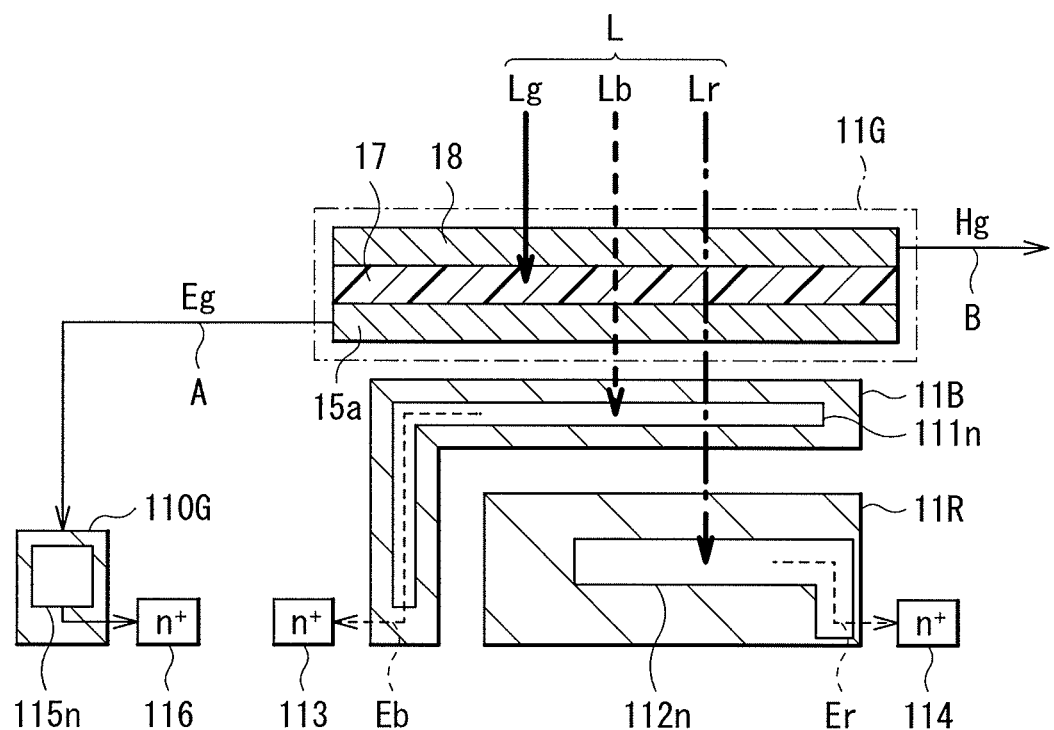

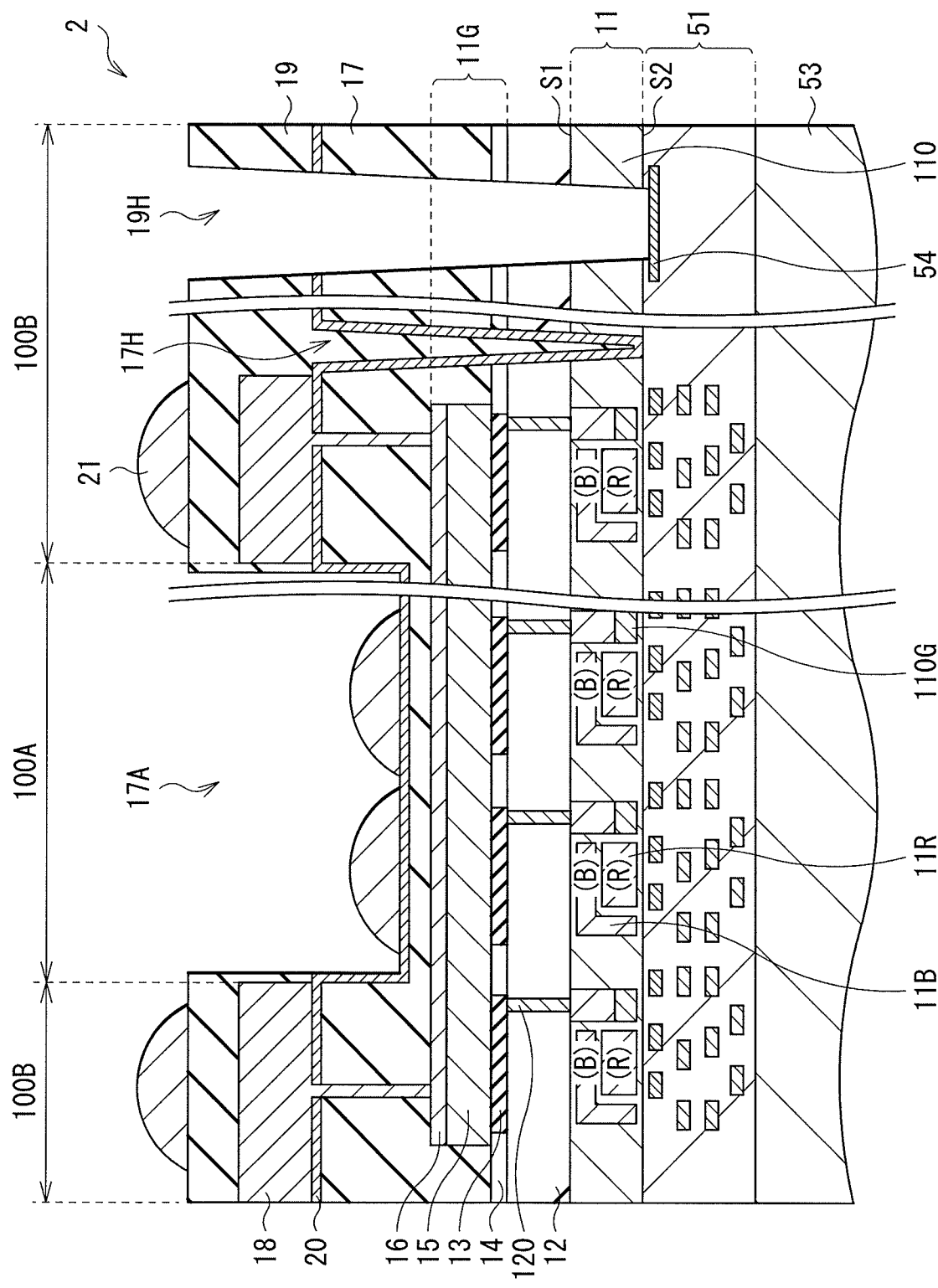
[FIG. 7]

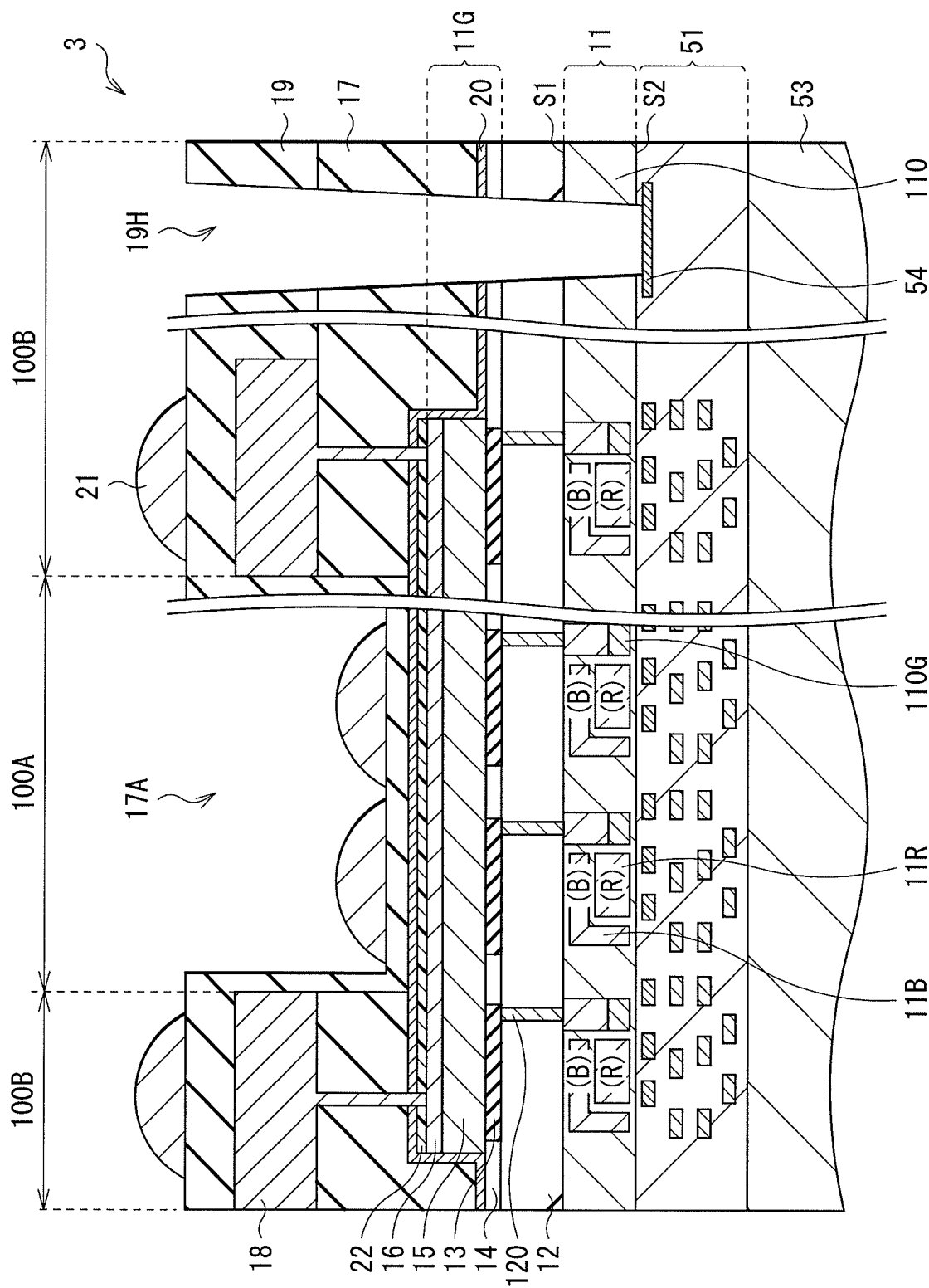
[FIG.8]

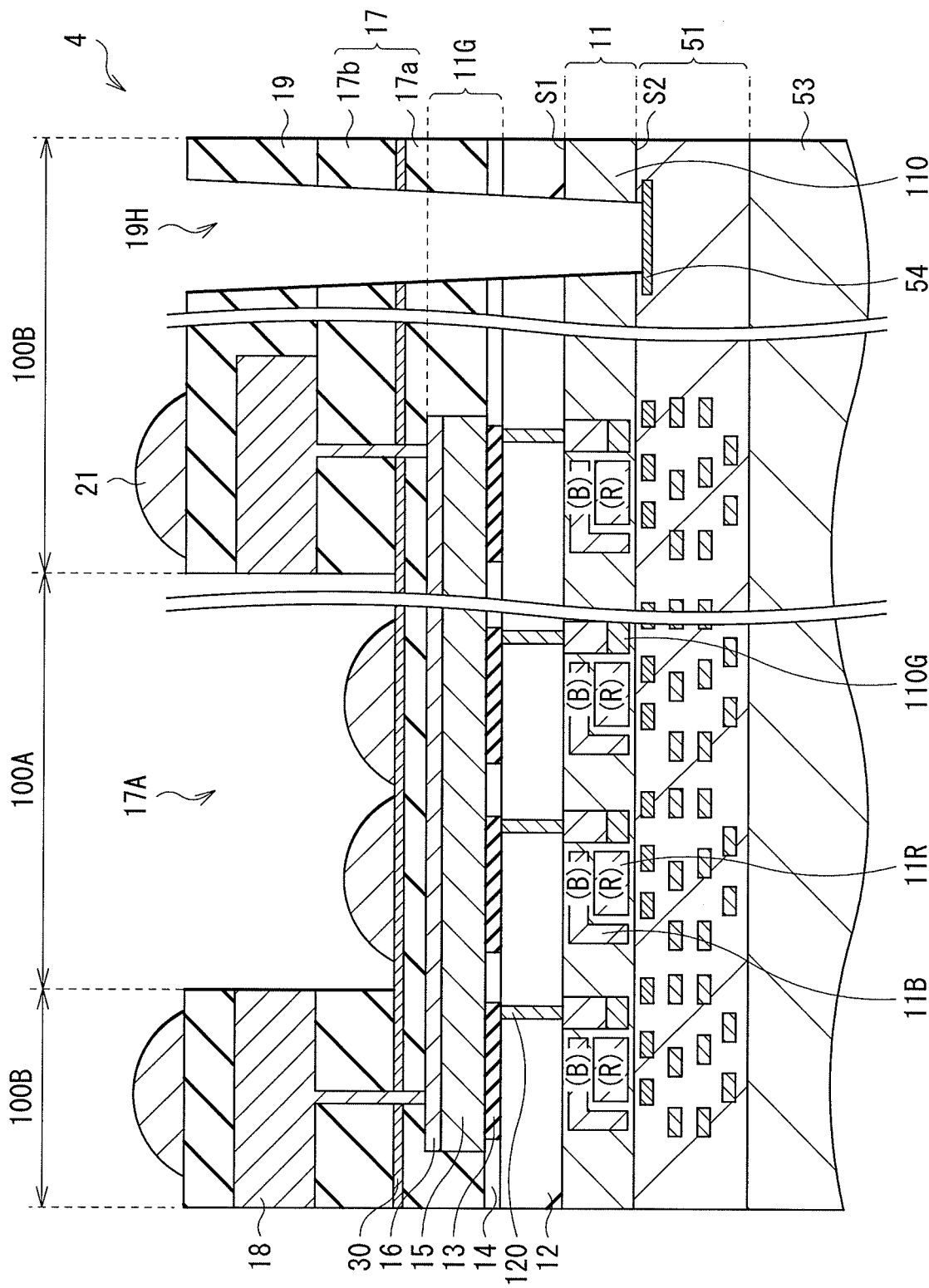
[FIG. 9]

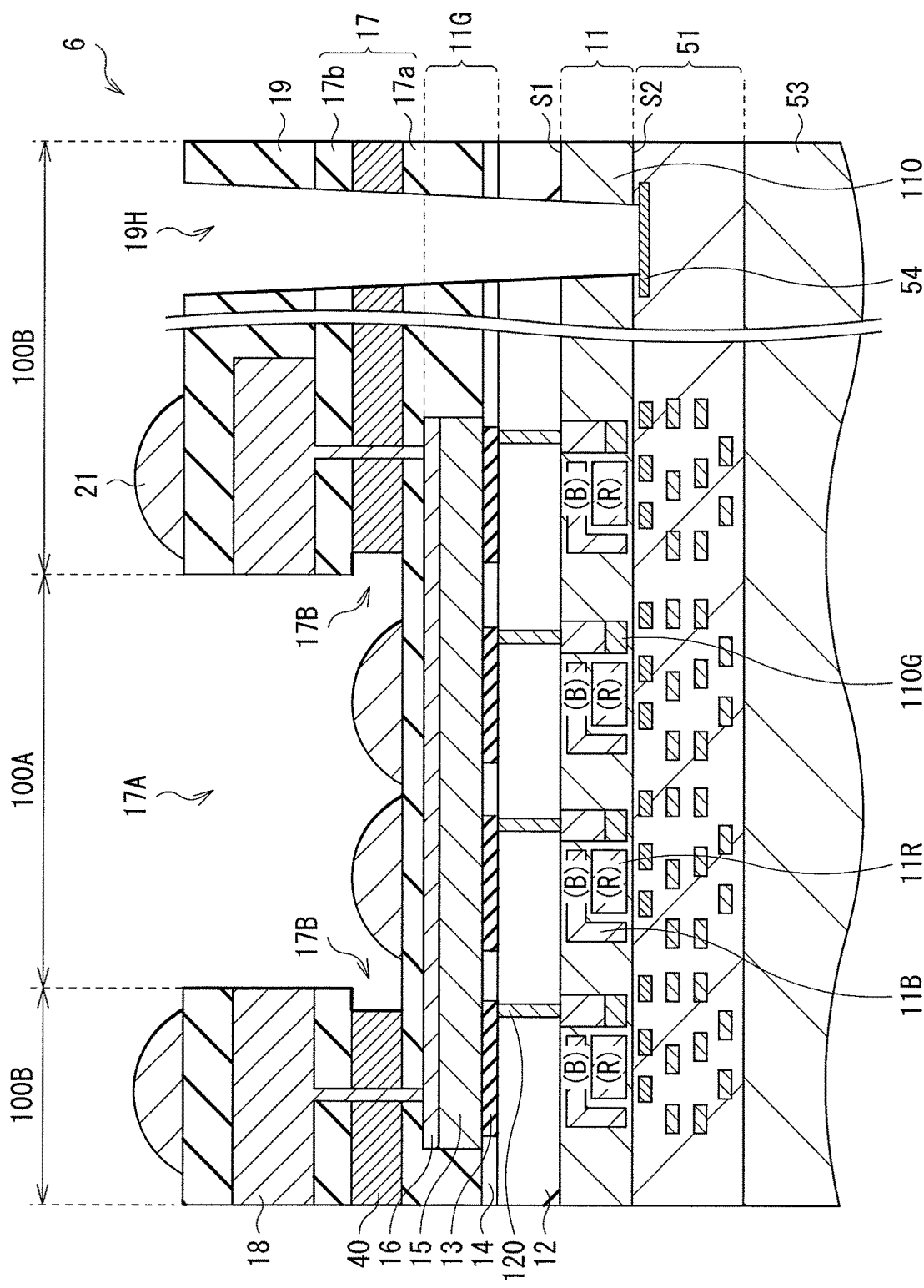
[FIG. 11]

[FIG. 12]
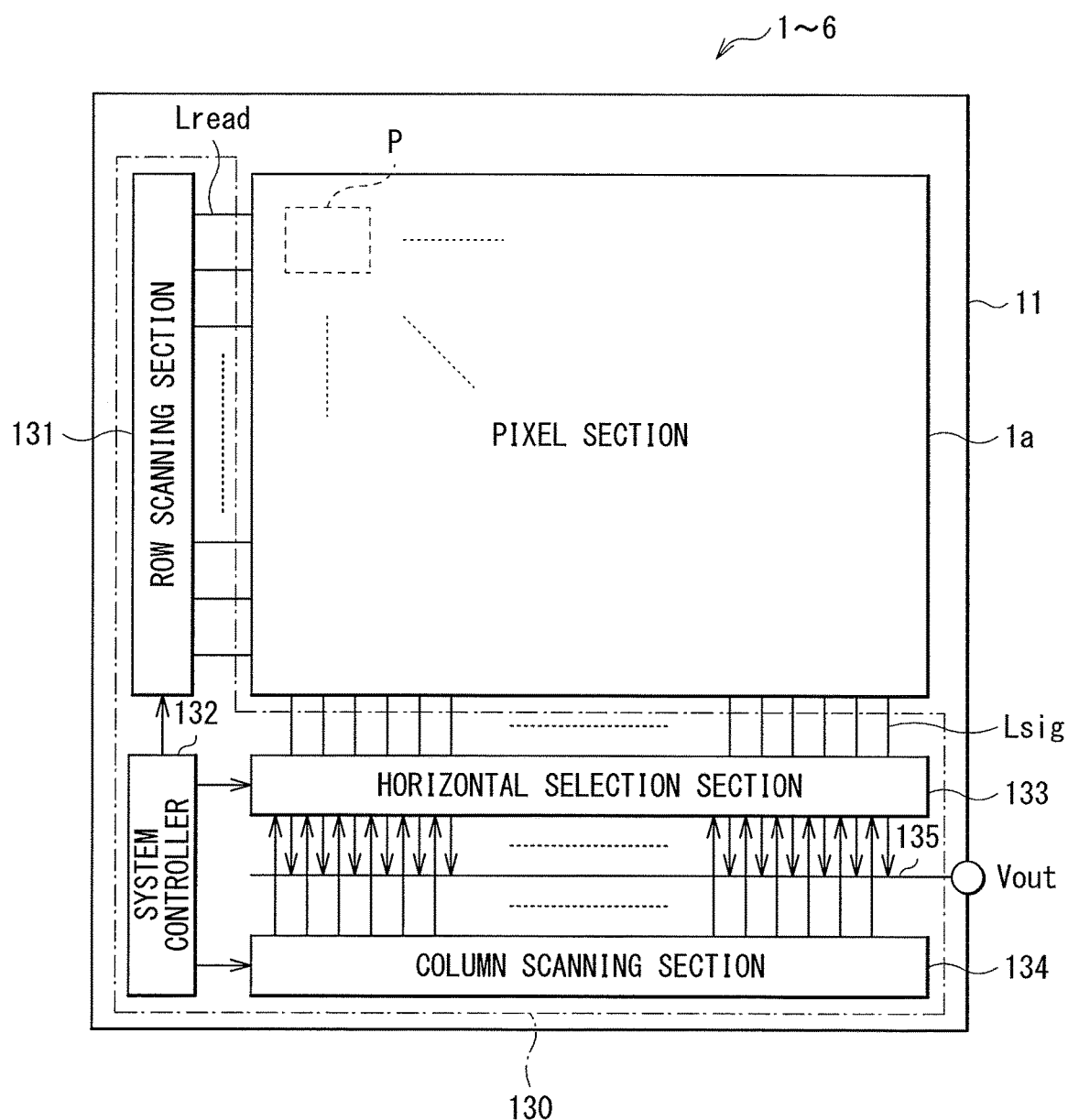

[ FIG. 13 ]
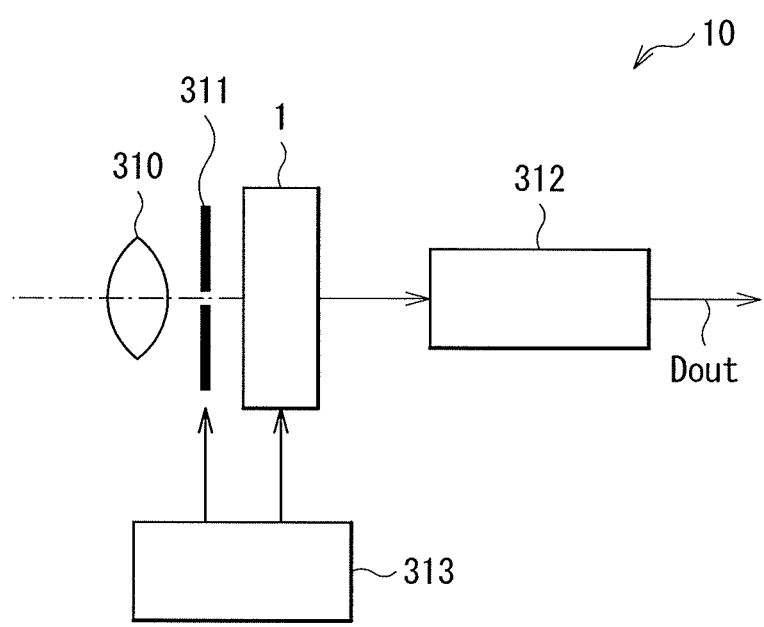

IMAGING DEVICE AND ELECTRONIC APPARATUS

CROSS REFERENCE TO RELATED APPLICATIONS

This application is a U.S. National Phase of International Patent Application No. PCT/JP2017/005512 filed on Feb. 15, 2017, which claims priority benefit of Japanese Patent Application No. JP 2016-071152 filed in the Japan Patent Office on Mar. 31, 2016. Each of the above-referenced applications is hereby incorporated herein by reference in its entirety.

TECHNICAL FIELD

The disclosure relates to an imaging device including an organic photoelectric conversion layer that uses an organic semiconductor material, and to an electronic apparatus.

BACKGROUND ART

In recent years, there has been progress in miniaturization of a pixel size in an imaging device such as a CCD (charge coupled device) image sensor or a CMOS (complementary metal oxide semiconductor) image sensor. The miniaturization of the pixel size causes reduction in the number of photons that enter a unit pixel, which contributes to lowered sensitivity as well as a lowered S/N ratio. Moreover, in a case where a color filter with a two-dimensional array of primary color filters of red, green and blue is used for colorization, light other than red light (color light of green and blue) is absorbed by the color filter, for example, in a red pixel, which brings about lowered sensitivity. Further, an interpolation process is performed between pixels upon generation of each color signal, thus causing occurrence of a so-called false color.

Accordingly, there has been developed an image sensor that includes a vertical stack of three photoelectric conversion layers and is able to acquire photoelectric conversion signals of three colors with one pixel. The photoelectric conversion layers detect light of different wavelength regions from one another, to generate electric signal charges corresponding thereto. As such an image sensor, for example, a stack of two photodiodes (inorganic photoelectric conversion sections) is provided inside a semiconductor substrate, while an organic photoelectric conversion film is provided above the semiconductor substrate. In this image sensor, blue light and red light are detected by the two photodiodes, while green light is detected by the organic photoelectric conversion film. Image sensors having such a structure are categorized into image sensors of a so-called front side illumination type and image sensors of a backside illumination type. In the front side illumination type, circuits and wirings are provided on side of a silicon substrate on which a light receiving surface is disposed. In the backside illumination type, circuits and wirings are provided on an opposite surface (back surface) of the silicon substrate to the light receiving surface. On the light receiving surface, the organic photoelectric conversion film is provided. The image sensor of the backside illumination type makes it possible to reduce a distance from the inorganic photoelectric conversion sections to the organic photoelectric conversion film by thicknesses of the circuits and the wirings. Hence, it is possible to suppress dependency on F values of each color, leading to suppression of variations in sensitivity of each color.

The organic photoelectric conversion film, however, varies greatly in characteristics under influences of stress of films to be formed in upper layers. Accordingly, for example, PTL 1 discloses a solid-state imaging device including a stress adjustment film on a top electrode formed on an organic photoelectric conversion film. The stress adjustment film is provided for reduction in influences of film stress generated in the top electrode on the organic photoelectric conversion film.

CITATION LIST

Patent Literature

PTL 1: Japanese Unexamined Patent Application Publication No. 2015-56554

SUMMARY OF INVENTION

Now, in a general image sensor, an optical black region is formed around an effective pixel region. The optical black region detects black. In the optical black region, a metal film such as W is formed as a light shielding film. But the metal film has high stress. This causes significant variations in characteristics of an organic photoelectric conversion film to be located below, contributing to a concern of a lowered photoelectric conversion characteristic.

Moreover, generally, organic photoelectric conversion films are not resistant to heat. Accordingly, a sealing film is formed, by a low-temperature process, above the organic photoelectric conversion film, in order to prevent intrusion of, for example, moisture into the organic photoelectric conversion film. However, the sealing film formed by the low-temperature process is easily degraded in film quality. The sealing film is, therefore, formed thick enough to ensure sealing properties. But a distance from the organic photoelectric conversion film and the inorganic photoelectric conversion sections to an on-chip lens becomes larger by the thickness of the sealing film. This causes a concern of a lowered oblique entrance characteristic.

It is desirable to provide an imaging device and an electronic apparatus that make it possible to enhance a photoelectric conversion characteristic, with improvement in an oblique entrance characteristic, while maintaining sealing properties and light shielding properties.

An imaging device according to an embodiment of the disclosure includes: a semiconductor substrate including an effective pixel region in which a plurality of pixels are disposed, and a peripheral region provided around the effective pixel region; an organic photoelectric conversion layer provided on side of the semiconductor substrate on which a light receiving surface is disposed; a first sealing layer provided on the semiconductor substrate; a recess provided in the first sealing layer on the effective pixel region; and a light shielding film provided on the first sealing layer on the peripheral region.

An electronic apparatus according to an embodiment of the disclosure includes the imaging device according to the embodiment of the disclosure as mentioned above.

In the imaging device and the electronic apparatus according to the respective embodiments of the disclosure, the recess is provided in the first sealing layer on the effective pixel region. The first sealing layer is provided on the effective pixel region and on the peripheral region thereof. This causes reduction in stress applied to the organic photoelectric conversion layer, while decreasing an entrance distance from an upper surface of the first sealing layer to the organic photoelectric conversion layer in the effective pixel region.

According to the imaging device and the electronic apparatus of the respective embodiments of the disclosure, the recess is formed in the first sealing layer on the effective pixel region. This leads to the reduction in the stress applied to the organic photoelectric conversion layer, while decreasing the entrance distance from the upper surface of the first sealing layer to the organic photoelectric conversion layer. Hence, it is possible to enhance the photoelectric conversion characteristic, with the improvement in the oblique entrance characteristic, while maintaining the sealing properties and the light shielding properties.

It is to be noted that effects of the disclosure are not necessarily limited to the effects described above, and may be any of the effects described in the disclosure.

BRIEF DESCRIPTION OF DRAWINGS

FIG. 1 is a cross-sectional view of a schematic configuration of an imaging device according to a first embodiment of the disclosure.

FIG. 2 is a schematic plan view of a plan configuration of a pixel region of the imaging device illustrated in FIG. 1.

FIG. 3A is a cross-sectional view of a configuration example of an inorganic photoelectric conversion section.

FIG. 3B is another cross-sectional view of the inorganic photoelectric conversion section illustrated in FIG. 3A.

FIG. 4 is a cross-sectional view of a configuration (extraction of electrons on lower side) of an electric charge (electron) accumulation layer of an organic photoelectric conversion section.

FIG. 5 is a characteristic diagram illustrating relation between a thickness of a sealing layer and a dark current.

FIG. 6 is a schematic diagram provided for description of workings of the imaging device illustrated in FIG. 1.

FIG. 7 is a cross-sectional view of an example of a schematic configuration of an imaging device according to a modification example 1 of the disclosure.

FIG. 8 is a cross-sectional view of another example of the schematic configuration of the imaging device according to the modification example 1 of the disclosure.

FIG. 9 is a cross-sectional view of a schematic configuration of an imaging device according to a second embodiment of the disclosure.

FIG. 11 is a cross-sectional view of a schematic configuration of an imaging device according to a third embodiment of the disclosure.

FIG. 12 is a functional block diagram of the imaging devices illustrated in FIGS. 1 and 7 to 10.

FIG. 13 is a block diagram of a schematic configuration of an electronic apparatus using the imaging device illustrated in FIG. 12.

MODES FOR CARRYING OUT THE INVENTION

Figure 10:
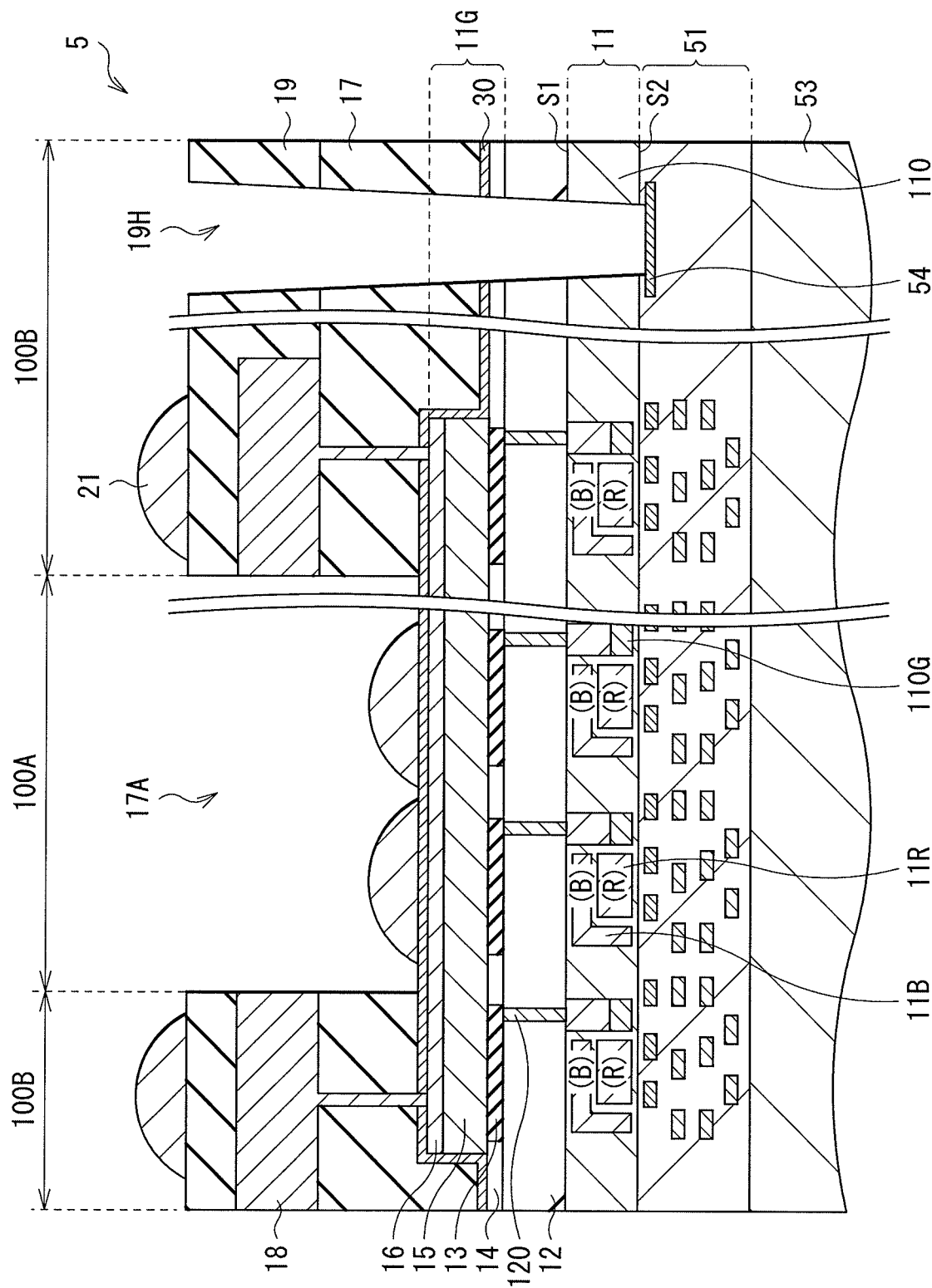
FIG. 10 is a cross-sectional view of a schematic configuration of an imaging device according to a modification example 2 of the disclosure.

In the following, some embodiments of the disclosure are described in detail with reference to drawings. It is to be noted that description is given in the following order.

1. First Embodiment (an example in which a recess is formed in a sealing layer on an effective pixel region)
  1-1. Configuration of Imaging Device
  1-2. Manufacturing Method
  1-3. Workings and Effects
2. Modification Example 1 (another example of a formation position of a high sealing layer)
3. Second Embodiment (an example in which an etching stopper film is provided inside the sealing layer)
4. Modification Example 2 (another example of a formation position of the etching stopper film)
5. Third Embodiment (an example in which a high etching rate layer is formed inside the sealing layer)
6. Application Examples 1. First Embodiment (1-1. Configuration of Imaging Device)

FIG. 1 illustrates a cross-sectional configuration of an imaging device (imaging device 1) according to a first embodiment of the disclosure. The imaging device 1 is, for example, a CCD image sensor or a CMOS image sensor of a backside illumination type (backside light receiving type). The imaging device 1 includes a pixel section 100 in which a plurality of pixels P are two-dimensionally arrayed on a semiconductor substrate 11 (for them all, refer to FIG. 13). It is to be noted that FIG. 1 illustrates a cross-sectional configuration along a line I-I illustrated in FIG. II. The pixel section 100 includes an effective pixel region 100A and an optical black (OPB) region 100B that is formed to surround the effective pixel region 100A.

The effective pixel region 100A includes one organic photoelectric conversion section (organic photoelectric conversion section 11G) and two inorganic photoelectric conversion sections (inorganic photoelectric conversion sections 11B and 11R), for each of the pixels P. The organic photoelectric conversion section 11G and the inorganic photoelectric conversion sections 11B and 11R selectively detect light of different wavelength regions from one another, to perform photoelectric conversion. The three photoelectric conversion sections (organic photoelectric conversion section 11R and inorganic photoelectric conversion sections 11B and 11R) are stacked in a vertical direction. The inorganic photoelectric conversion sections 11B and 11R are formed to be embedded inside the semiconductor substrate 11. The organic photoelectric conversion section 11G is provided on back-surface (light-receiving surface (surface 51)) side of the semiconductor substrate 11. A sealing layer 17 and an on-chip lens 21 are formed on the organic photoelectric conversion section 11G. Pixel transistors (inclusive of transfer transistors Tr1 to Tr3 described later) and a multi-layer wiring layer (multi-layer wiring substrate 51) are formed on front-surface (surface (surface S2) on opposite side to the light receiving surface) side of a semiconductor substrate 11.

The OPB region 100B outputs optical black that serves as a reference of a black level. The OPB region 100B includes, for example, a light shielding film 18 that defines the black level. The light shielding film 18 is provided on the light-receiving-surface (surface-S1) side of the semiconductor substrate 11, with the sealing layer 17 in between. The sealing layer 17 extends from the effective pixel region 100A. A sealing layer 19 and the on-chip lens 21 are provided on the light shielding film 18. A contact hole 19H is provided along, for example, one side of the OPB region 100B. The contact hole 19H is made through from the sealing layer 19 to the front surface (surface S2) of the semiconductor substrate 11. The contact hole 19H is a transmission path for discharge of an electric charge (hole or electron) that has been photoelectrically converted in an organic photoelectric conversion layer 15. For example, the electric charge (e.g., electron) generated by the photoelectric conversion in the organic photoelectric conversion layer 15 reaches a pad 54 through a bottom electrode 13, an electrically-conductive plug 120, a circuit on the semiconductor substrate 11, and, for example, a wiring line 51a provided in the multi-layer wiring substrate 51. It is to be noted that in the OPB region 100B, the organic photoelectric conversion section 11G and the inorganic photoelectric conversion sections 11B and 11R may be provided extensively from the effective pixel region 100A. It is not necessary to provide the on-chip lens 21 on the OPB region 100B. The on-chip lens 21 on the OPB region 100B may be omitted as appropriate.

The imaging device 1 of this embodiment includes a cavity structure 17A on the effective pixel region 100A. The cavity structure 17A is a recess formed in the sealing layer 17 provided on the organic photoelectric conversion section 11G. Forming the cavity structure 17A allows for a low profile of the sealing layer 17, and reduction in a distance from an exit surface of the on-chip lens 21 to each of the photoelectric conversion sections (the organic photoelectric conversion section 11G and the inorganic photoelectric conversion sections 11B and 11R), leading to improvement in an oblique entrance characteristic. Moreover, in this embodiment, a high sealing layer 20 is provided between the on-chip lens 21 and the sealing layer 19. The high sealing layer 20 is continuous from the effective pixel region 100A to the OPB region 100B. This makes it possible to prevent intrusion of, for example, moisture through a bottom surface or a side surface of the cavity structure 17A. In the following, described is a configuration of each layer.

In the semiconductor substrate 11, for example, the inorganic photoelectric conversion sections 11B and 11R are formed to be embedded in a predetermined region of an n-type silicon (Si) layer 110. In the semiconductor substrate 11, moreover, embedded is an electricity storage layer for green 110G that accumulates the electric charge (electron or hole) from the organic photoelectric conversion section 11G. On the front-surface (surface-S2) side of the semiconductor substrate 11, a plurality of the pixel transistors (inclusive of the transfer transistors Tr1 to Tr3) and a peripheral circuit are formed. The pixel transistors correspond to respective ones of the organic photoelectric conversion section 11G and the inorganic photoelectric conversion sections 11B and 11R. The peripheral circuit includes, for example, a logic circuit.

Examples of the pixel transistors include a transfer transistor, a reset transistor, an amplifying transistor, and a selection transistor. Each of these pixel transistors is configured, for example, by a MOS transistor, and is formed in a p-type semiconductor well region on the surface-S2 side. A circuit that includes such pixel transistors is formed for each of the photoelectric conversion sections of red, green, and blue. Each of the circuits may have a three-transistor configuration that includes three transistors in total, configured by the transfer transistor, the reset transistor, and the amplifying transistor, for example, among these pixel transistors. Alternatively, each of the circuits may have a four-transistor configuration that includes the selection transistor in addition thereto. Here, illustration and description are given only of the transfer transistors Tr1 to Tr3 among these pixel transistors (for example, refer to FIGS. 3A and 3B). Further, the pixel transistor other than the transfer transistors may be shared by the photoelectric conversion sections or by the pixels. Furthermore, a so-called pixel-shared structure may also be applied in which a floating diffusion is shared.

The transfer transistors Tr1 to Tr3 each include a gate electrode (gate electrode TG1, TG2, or TG3) and a floating diffusion (FD 113, 114, or 116). The transfer transistor Tr1 transfers, to a later-described vertical signal line Lsig, a signal electric charge (electron, in this embodiment) corresponding to a green color that is generated in the organic photoelectric conversion section 11G and is accumulated in the electricity storage layer for green 110G. The transfer transistor Tr2 transfers, to the later-described vertical signal line Lsig, a signal electric charge (electron, in this embodiment) corresponding to a blue color that is generated and accumulated in the inorganic photoelectric conversion section 11B. Likewise, the transfer transistor Tr3 transfers, to the later-described vertical signal line Lsig, a signal electric charge (electron, in this embodiment) corresponding to a red color that is generated and accumulated in the inorganic photoelectric conversion section 11R.

The inorganic photoelectric conversion sections 11B and 11R are each a photodiode (Photo Diode) that has a p-n junction. The inorganic photoelectric conversion sections 11B and 11R are formed in order from the surface-S1 side on an optical path inside the semiconductor substrate 11. Among these, the inorganic photoelectric conversion section 11B selectively detects blue light and accumulates the signal electric charge corresponding to the blue color. The inorganic photoelectric conversion section 11B is formed to extend, for example, from a selective region along the surface S1 of the semiconductor substrate 11 to a region near an interface with the multi-layer wiring substrate 51. The inorganic photoelectric conversion section 11R selectively detects red light and accumulates the signal electric charge corresponding to the red color. The inorganic photoelectric conversion section 11R is formed, for example, in a region in a lower layer (on the surface-S2 side) than the inorganic photoelectric conversion section 11B. It is to be noted that the blue (B) is a color that corresponds to a wavelength region of 400 nm to 480 nm both inclusive, for example, and the red (R) is a color that corresponds to a wavelength region of 600 nm to 700 nm, for example. It suffices for the inorganic photoelectric conversion sections 11B and 11R to be able to detect light of a portion or an entirety of the respective wavelength regions described above.

FIG. 3A illustrates a detailed configuration example of the inorganic photoelectric conversion sections 11B and 11R. FIG. 3B corresponds to a configuration in another cross-section in FIG. 3A. It is to be noted that, in this embodiment, description is given of a case where, out of a pair of an electron and a hole generated by the photoelectric conversion, the electron is read as the signal electric charge (case where an n-type semiconductor region serves as a photoelectric conversion layer). Further, in the drawing, a superscript "+(plus)" attached to "p" or "n" indicates that a p-type or n-type impurity concentration is high. Furthermore, the gate electrodes TG2 and TG3 of the transfer transistors Tr2 and Tr3 out of the pixel transistors are also illustrated.

The inorganic photoelectric conversion section 11B includes, for example, a p-type semiconductor region (hereinafter, simply referred to as a "p-type region", applicable likewise to a case of n-type) 111p that serves as a hole accumulation layer, and an n-type photoelectric conversion layer (n-type region) 111n that serves as an electron accumulation layer. The p-type region 111p and the n-type photoelectric conversion layer 111n are each formed in a selective region near the surface S1. A portion of each of the p-type region 111p and the n-type photoelectric conversion layer 111n is bent, and is so formed and extended as to reach an interface with the surface S2. The p-type region 111p is coupled to an unillustrated p-type semiconductor well region on the surface-S1 side. The n-type photoelectric conversion layer 111n is coupled to the FD 113 (n-type region) of the transfer transistor Tr2 for the blue color. It is to be noted that a p-type region 113p (hole accumulation layer) is formed near an interface between the surface S2 and each of end portions of the p-type region 111p and the n-type photoelectric conversion layer 111n on the surface-S2 side.

The inorganic photoelectric conversion section 11R is so formed as to interpose, for example, an n-type photoelectric conversion layer 112n (electron accumulation layer) between p-type regions 112p1 and 112p2 (hole accumulation layers) (i.e., has a p-n-p stacked structure). A portion of the n-type photoelectric conversion layer 112n is bent, and is so formed and extended as to reach the interface with the surface S2. The n-type photoelectric conversion layer 112n is coupled to the FD 114 (n-type region) of the transfer transistor Tr3 for the red color. It is to be noted that the p-type region 113p (hole accumulation layer) is formed at least near the interface between the surface S2 and an end portion of the n-type photoelectric conversion layer 111n on the surface-S2 side.

FIG. 4 illustrates a detailed configuration example of the electricity storage layer for green 110G. It is to be noted that description is given here of a case where, out of a pair of an electron and a hole generated by the organic photoelectric conversion section 11G, the electron serves as the signal electric charge, and is read from bottom-electrode-13 side. Further, FIG. 4 also illustrates the gate electrode TG1 of the transfer transistor Tr1 out of the pixel transistors.

The electricity storage layer for green 110G includes an n-type region 115n that serves as an electron accumulation layer. A portion of the n-type region 115n is coupled to the electrically-conductive plug 120, and accumulates electrons supplied from the bottom-electrode-13 side via the electrically-conductive plug 120. The n-type region 115n is also coupled to the FD 116 (n-type region) of the transfer transistor Tr1 for the green color. It is to be noted that a p-type region 115p (hole accumulation layer) is formed near an interface between the n-type region 115n and the surface S2.

The electrically-conductive plug 120 functions as a connector between the organic photoelectric conversion section 11G and the semiconductor substrate 11, and serves as a transmission path for the electric charge (electron, here) generated in the organic photoelectric conversion section 11G. The electrically-conductive plug 120 is in electrically-conductive relation to the bottom electrode 13 of the organic photoelectric conversion section 11G, and is coupled to the electricity storage layer for green 110G. It is to be noted that the top electrode 16 of the organic photoelectric conversion section 11G is in electrically-conductive relation to the light shielding film 18 described later, and serves as a transmission path for discharge of holes.

The electrically-conductive plug 120 is provided inside an insulating layer 12 provided between the semiconductor substrate 11 and the organic photoelectric conversion section 11G. The electrically-conductive plug 120 is desirably configured by, for example, a stacked film of metal materials such as titanium (Ti), titanium nitride (TiN), tungsten (W), and aluminum (Al), for purposes of not only coupling of the bottom electrode 13 to the electricity storage layer for green 110G but also functioning as a light shielding film.

The insulating layer 12 preferably has a small interface state in order to reduce an interface state with the semiconductor substrate 11 (Si layer 110) and to suppress occurrence of a dark current from an interface between the Si layer 110 and the insulating layer 12. Such an insulating layer 12 is exemplified by a stacked film of, for example, a hafnium oxide ($HfO_2$) film deposited by an ALD (atomic layer deposition) method and, for example, a $SiO_2$ film deposited by a plasma CVD method.

The multi-layer wiring substrate 51 is formed on the surface S2 of the semiconductor substrate 11. In the multi-layer wiring substrate 51, a plurality of the wiring lines 51a are provided through an interlayer insulating film 52. In this manner, in the imaging device 1, the multi-layer wiring substrate 51 is formed on opposite side to the light receiving surface (surface S1), making it possible to achieve a so-called backside illumination type imaging device. A support substrate 53 containing silicon, for example, is joined to the multi-layer wiring substrate 51.

The organic photoelectric conversion section 11G absorbs, with the use of an organic semiconductor, light of a selective wavelength region (here, green light), thus generating an electron-hole pair. The organic photoelectric conversion section 11G has a configuration in which the organic photoelectric conversion layer 15 is interposed between the bottom electrode 13 and the top electrode 16 that extract the signal electric charge. As described above, the bottom electrode 13 and the top electrode 16 are each electrically coupled to the electrically-conductive plug 120 and the light shielding film 18.

Specifically, in the organic photoelectric conversion section 11G, the insulating layer 12 is formed on the surface Si of the semiconductor substrate 11. On the insulating layer 12, the bottom electrodes 13 are provided on a pixel-by-pixel basis. The bottom electrodes 13 provided on the pixel-by-pixel basis are electrically separated by an insulating layer 14. On the bottom electrodes 13, for example, the organic photoelectric conversion layer 15 common to the pixels P is formed. The top electrode 16 is so formed as to cover the organic photoelectric conversion layer 15. Although details are described later, on the top electrode 16, the sealing layer 17 is so formed as to cover a surface of the top electrode 16.

The insulating layer 14 is configured by, for example, a monolayer film containing one kind of, for example, silicon oxide, silicon nitride, and silicon oxynitride, or alternatively, the insulating layer 14 is configured by a stacked film containing two or more kinds thereof. The insulating layer 14 has, for example, a planarized surface and has a substantially stepless shape and pattern with respect to the bottom electrode 13.

The bottom electrode 13 is provided at a region that faces light receiving surfaces of the inorganic photoelectric conversion sections 11B and 11R formed inside the semiconductor substrate 11 and covers the light receiving surfaces. The bottom electrode 13 is configured by an electrically-conductive film having light-transmissivity, and includes ITO (indium tin oxide), for example. However, as a constituent material of the bottom electrode 13, a dopant-doped tin oxide ($SnO_2$)-based material or a zinc oxide-based material in which aluminum zinc oxide (ZnO) is doped with a dopant may be used, besides the ITO. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). Moreover, besides, for example, CuI, $InSbO_4$, ZnMgO, $CuInO_2$, $MgIN_2O_4$, CdO, and $ZnSnO_3$ may be used.

The organic photoelectric conversion layer 15 performs the photoelectric conversion of the light of the selective wavelength region (green light, in this embodiment), while transmitting light of other wavelength regions. Materials that constitute the organic photoelectric conversion layer 15 preferably include an organic p-type semiconductor or an organic n-type semiconductor, or both. It is desirable that the organic photoelectric conversion layer 15 have, for example, a p-i-n bulk hetero structure including a p-type blocking layer, a p-type and n-type co-deposited layer, and an n-type blocking layer.

As the organic p-type semiconductor and the organic n-type semiconductor, for example, preferably used are one kind of, or two or more kinds of, a quinacridone derivative, a naphthalene derivative, an anthracene derivative, a phenanthrene derivative, tetracene derivative, a pyrene derivative, a perylene derivative, and a fluoranthene derivative. Besides, examples include a polymer or its derivative of, for example, phenylenebinylene, fluorene, carbazole, indole, pyrene, pyrole, picoline, thiophene, acetylene, and diacetylene. Furthermore, preferably used may be, for example: a linear compound in which condensed polycyclic aromatic and aromatic ring or heterocyclic compounds such as a metal complex pigment, a cyanine-based pigment, a melocyanine-based pigment, a phenylxanthene-based pigment, a triphenylmethane-based pigment, a rhodacyanine-based pigment, a xanthene-based pigment, a large ring azaannulene-based pigment, an azulene-based pigment, naphthoquinone, an anthraquinone-based pigment, anthracene, and pyrene are condensed; or two nitrogen-including heterocyclic such as quinoline, benzothiazole, and benzoxazole including a squarylium group and a chrochonic methine group as a binding chain; or a cyanine-based or similar pigment bonded by a squarylium group and a chrochonic methine group. As the metal complex pigment as mentioned above, preferable is a dithiol metal complex-based pigment, a metal phthalocyanine pigment, a metal porphyrin pigment, or a ruthenium complex pigment. In particular, the ruthenium complex pigment is preferable. The materials as exemplified above function as the organic p-type semiconductor or the organic n-type semiconductor inside the organic photoelectric conversion layer 15, depending on a material to be combined with.

Any other unillustrated layer may be provided between the organic photoelectric conversion layer 15 and the bottom electrode 13, and between the organic photoelectric conversion layer 15 and the top electrode 16. For example, an underlying film, a hole transport layer, an electron blocking film, the organic photoelectric conversion layer 15, a hole blocking film, a buffer film, an electron transport layer, and a work function adjustment film may be stacked in order from the bottom-electrode-13 side. For the electron blocking film, the hole blocking film, the electron transport layer, and the hole transport layer, the material exemplified for the organic photoelectric conversion layer 15 may be used.

The top electrode 16 is configured by an electrically-conductive film having light-transmissivity similar to that of the bottom electrode 13. The top electrode 16 may be separated on the pixel-by-pixel basis, or may be formed as an electrode common to the pixels P.

The sealing layer 17 is provided on, for example, an entire surface of the semiconductor substrate 11. That is, the sealing layer 17 is provided to be continuous in the effective pixel region 100A and the OPB region 100B. The sealing layer 17 is provided for surface planarization and prevention of intrusion of, for example, moisture into the organic photoelectric conversion layer 15. The sealing layer 17 includes a material having light-transmissivity. Examples of the material having light transmissivity include silicon oxide, silicon nitride, and silicon oxynitride. The sealing layer 17 is a monolayer including any one thereof, or a stacked film including two or more kinds thereof.

In this embodiment, as mentioned above, the cavity structure 17A is formed in the sealing layer 17 at a position corresponding to the effective pixel region 100A. The cavity structure 17A is the recess provided in the sealing layer 17. A depth ($W_1$) of the cavity structure 17A and a thickness ($W_2$) of the sealing layer 17 in the effective pixel region 100A are each determined from relation of a thickness ($W_0$) from the top electrode 16 to a surface of the sealing layer 17 in the OPB region 100B to an oblique entrance characteristic, sealing properties, and a dark current. For example, the depth ($W_1$) of the cavity structure 17A is preferably as large as possible in view of the oblique entrance characteristic. The depth ($W_1$) of the cavity structure 17A is preferably smaller than the thickness ($W_0$) of the sealing layer 17 in view of the sealing properties. However, this does not apply to a case where the high sealing layer 20 described later is formed on the sealing layer 17. FIG. 5 illustrates the relation of the thickness ($W_0$) from the top electrode 16 to the surface of the sealing layer 17 in the OPB region 100B to the dark current of the organic photoelectric conversion layer 15 in the OPB region 100B. The dark current exhibits a tendency of an increase, as the thickness ($W_0$) of the sealing layer 17 becomes about 0.4 μm or less. The dark current significantly increases, as the thickness ($W_0$) of the sealing layer 17 becomes 0.1 μm or less. This is because stress of the light shielding film 18 to be formed on the sealing layer 17 is applied to the organic photoelectric conversion layer 15. As the dark current increases, an increase in the number of white spots, or peeling off of a film of the organic photoelectric conversion layer 15 during a manufacture process becomes more likely. From the forgoing, the thickness ($W_0$) of the sealing layer 17 is preferably 0.1 μm or more.

The light shielding film 18 is formed on the sealing layer 17 in the OPB region 100B. Examples of a material of the light shielding film 18 include W, Ti, TiN, or aluminum (Al). The light shielding film 18 is configured by, for example, a stacked film of W/TiN/Ti, or a W monolayer film. A thickness of the light shielding film 18 is, for example, 50 nm to 400 nm both inclusive. The light shielding film 18 is electrically coupled to the top electrode 16 through a through hole 170, and functions as a transmission path of the electric charge (hole, in this embodiment) generated in the organic photoelectric conversion section 11G.

The sealing layer 19 is provided on the light shielding film 18 provided in the OPB region 100B, and on the sealing layer 17 in the effective pixel region 100A. On the sealing layer 19, for example, the on-chip lens 21 (microlens) is provided on the pixel-by-pixel basis. The on-chip lens 21 condenses light entering from above to each light receiving surface of the organic photoelectric conversion section 11G and the inorganic photoelectric conversion sections 11B and 11R. In this embodiment, forming the cavity structure 17A inside the effective pixel region 100A makes it possible to dispose the light receiving surfaces of the organic photoelectric conversion section 11G and the inorganic photoelectric conversion sections 11B and 11R closer to one another. This leads to the improvement in the oblique entrance characteristic. It is to be noted that a color filter that controls spectroscopy may be provided below the on-chip lens 21. Moreover, it suffices to provide the on-chip lens 21 on the pixel P at least in the effective pixel region 100A. FIG. 1 illustrates the on-chip lenses 21 provided in the OPB region 100B, but they may be omitted as appropriate.

Moreover, it is preferable that the continuous high sealing layer 20 be provided on the sealing layer 19 inclusive of the side surface and the bottom surface of the cavity structure 17A (between the sealing layer 19 and the on-chip lens 21). The high sealing layer 20 is, for example, a SiCO film, an AlO film, an AlN film, a SiN film, a SiON film, or a SiCN film. The high sealing layer 20 prevents intrusion of, for example, moisture through the bottom surface or the side surface of the cavity structure 17A, and is preferably formed on a side surface of the contact hole 19H as well. This makes it possible to prevent intrusion of, for example, moisture through the side surface of the contact hole 19H as well. It is to be noted that the high sealing layer 20 may be provided inside the sealing layer 17. In providing the high sealing layer 20 inside the sealing layer 17, examples of a specific position is between the bottom surface of the cavity structure 17A and the top electrode 16 of the organic photoelectric conversion section 11G. This makes it possible to reduce intrusion of, for example, moisture into the organic photoelectric conversion layer 15 from the cavity structure 17A.

It is to be noted that a dummy region 100C is preferably provided in a peripheral region of the effective pixel region 100A. The peripheral region of the effective pixel region 100A includes the OPB region 100B in the proximity of the effective pixel region 100A. Specifically, it is preferable that photoelectric conversion sections (the organic photoelectric conversion section 11G and the inorganic photoelectric conversion sections 11B and 11R) provided at a position corresponding to an end of the light shielding film 18, and a few pixels in a periphery of the effective pixel region 100A serve as dummy pixels. This makes it possible to allow influences of level differences of the cavity structure 17A on optical characteristics to be ignorable.

(1-2. Manufacturing Method)

It is possible to manufacture the imaging device 1, for example, as follows.

First, the semiconductor substrate 11 is formed. Specifically, a so-called SOI substrate is prepared, in which the silicon layer 110 is formed on a silicon base, with a silicon oxide film being interposed therebetween. It is to be noted that a surface on silicon-oxide-film side of the silicon layer 110 serves as the back surface (surface S1) of the semiconductor substrate 11. Thereafter, inside the silicon layer 110, the inorganic photoelectric conversion sections 11B and 11R each including a p-type region and an n-type region, and the electricity storage layer for green 110G are formed by ion implantation. Thus, the semiconductor substrate 11 is formed.

Thereafter, the pixel transistors including the transfer transistors Tr1 to Tr3, and the peripheral circuit such as the logic circuit are formed on the surface-S2 side of the semiconductor substrate 11. Thereafter, the wiring lines 51a in a plurality of layers are formed on the surface S2 of the semiconductor substrate 11 through the interlayer insulating film 52, to thereby form the multi-layer wiring substrate 51. Thereafter, the support substrate 53 including silicon is joined onto the multi-layer wiring substrate 51.

Next, the organic photoelectric conversion section 11G is formed on the surface S1 of the semiconductor substrate 11. Specifically, first, the insulating layer 12 configured by the stacked film of the hafnium oxide film and the silicon oxide film as described above is formed on the surface S1 of the semiconductor substrate 11. For example, the hafnium oxide film is formed by the ALD (atomic layer deposition) method, and thereafter, for example, the silicon oxide film is formed by the plasma CVD (chemical vapor deposition) method. Thereafter, the electrically-conductive plug 120 is formed at a position facing the electricity storage layer for green 110G, within the insulating layer 12. In this situation, the electrically-conductive plug 120 may be formed to expand to a region that is desired to be shielded against light (to cover the region that is desired to be shielded against light). Alternatively, a light shielding film may be formed in a region separated from the electrically-conductive plug 120.

Thereafter, the insulating layer 14 including the above-described material is formed by the plasma CVD method, for example. It is to be noted that, after the formation of the film, a surface of the insulating layer 14 is desirably planarized by a CMP (chemical mechanical polishing) method, for example. Thereafter, contact holes are opened at positions facing the electrically-conductive plugs 120 of the insulating layer 14. The contact holes are filled with the above-described material to form the bottom electrodes 13. Thereafter, with the use of the CMP method, for example, a residual wiring layer material (such as tungsten) on the insulating layer 14 is desirably removed. It is to be noted that patterning of the bottom electrodes 13 may be carried out prior to patterning of the insulating layer 14, or vice versa.

Thereafter, on the bottom electrodes 13, the organic photoelectric conversion layer 15 is formed with the use of, for example, a vapor deposition method or a coating method. It is to be noted that, as described above, in forming other organic layers (such as the electron blocking layer) as an upper layer or a lower layer of the organic photoelectric conversion layer 15, it is desirable to form the layers successively in a vacuum process (through a vacuum consistent process) with the use of the same metal mask. Further, the film-forming method of the organic photoelectric conversion layer 15 is not necessarily limited to the above-described method with the use of the metal mask; any other method, for example, a printing technique, may be used.

Thereafter, the top electrode 16 and the sealing layer 17 are formed. First, the top electrode 16 configured by the above-described transparent electrically-conductive film is formed, by the vacuum deposition method or a sputtering method, for example, over an entire substrate surface, to cover the upper surface and the side surfaces of the organic photoelectric conversion layer 15. It is to be noted that the top electrode 16 is desirably formed through the vacuum consistent process with the organic photoelectric conversion layer 15, because the organic photoelectric conversion layer 15 varies easily in characteristics under influences of, for example, moisture, oxygen, and hydrogen. Thereafter (before patterning of the top electrode 16), the sealing layer 17 including the above-described material is formed by the plasma CVD method, for example, to cover an upper surface of the top electrode 16. Thereafter, patterning is carried out by etching with the use of a photolithography method, and thereafter, the top electrode 16 and the organic photoelectric conversion layer 15 are processed with the use of, for example, a dry etching method. Afterwards, deposits and residues are removed by a post process such as ashing and organic cleaning.

Thereafter, the light shielding film 18 is formed on the sealing layer 17. For example, the light shielding film 18 is patterned with the use of the photolithography method, and thereafter, the light shielding film 18 is processed with the use of the dry etching method. Thereafter, the sealing layer 17 is etched, with the light shielding film 18 serving as a hard mask, to form the cavity structure 17A at the position corresponding to the effective pixel region 100A. Thereafter, after removal of deposits and residues by a post process such as ashing and organic cleaning, the sealing layer 19 is formed with the use of a similar method to that of the sealing layer 17. It is to be noted that the cavity structure 17A may be formed after the formation of the sealing layer 19, by patterning with the use of the photolithography and using the dry etching method. In this case, the sealing layer 19 inside the cavity structure 17A is removed.

Thereafter, the contact hole 19H is formed along one side of the OPB region 100B, for example, by etching with the use of the photolithography method. The contact hole 19H is made through the semiconductor substrate 11 from the sealing layer 19. Thereafter, for example, the high sealing layer 20 including SiCO is formed over entire surfaces of the effective pixel region 100A and the OPB region 100B. Thereafter, the high sealing layer 20 formed on a bottom surface over the contact hole 19H is removed by, for example, the dry etching method, to allow the pad 54 to be exposed. Finally, the on-chip lens 21 is formed on the high sealing layer 20 in the effective pixel region 100A and the OPB region 100B. Thus, the imaging device 1 illustrated in FIG. 1 is completed.

In the imaging device 1 as described above, the signal electric charge is acquired as follows. That is, as illustrated in FIG. 6, upon light L entering the imaging device 1 through the on-chip lens 21, the light L passes through the organic photoelectric conversion section 11G and the inorganic photoelectric conversion sections 11B and 11R in order, and undergoes the photoelectric conversion of each color of red, green, and blue during the process of passage. It is to be noted that in the following, described is the acquisition of each signal by giving an exemplary case where the electron serves as the signal electric charge and the electron is read through the bottom electrode 13. However, the hole may serve as the signal electric charge and the hole is read through the bottom electrode 13.

(Acquisition of Green Signal by Organic Photoelectric Conversion Section 11G)

Out of the pieces of the light L entering the imaging device 1, first, green light Lg is selectively detected (absorbed) in the organic photoelectric conversion section 11G to undergo the photoelectric conversion. Accordingly, an electron Eg out of the electron-hole pair generated is extracted from the bottom-electrode-13 side, and thereafter, is accumulated into the electricity storage layer for green 110G through a transmission path A (e.g., the electrically-conductive plugs 120). The accumulated electron Eg is transferred to the FD 116 upon reading operation. It is to be noted that a hole Hg is discharged from top-electrode-16 side through a transmission path B.

Specifically, the signal electric charge is accumulated as follows. That is, in this embodiment, for example, a predetermined negative potential VL (<0 V) is applied to the bottom electrode 13, while a potential VU (<VL) lower than the potential VL is applied to the top electrode 16. It is to be noted that the potential VL is supplied, for example, from the wiring line 51a inside the multi-layer wiring substrate 51 to the bottom electrode 13 through the transmission path A. The potential VL is supplied, for example, from the wiring line 51a inside the multi-layer wiring substrate 51 to the top electrode 16 through the transmission path B. Accordingly, in a state where an electric charge is accumulated (where the unillustrated reset transistor and the transfer transistor Tr1 are each in an OFF state), the electron, out of the electron-hole pair generated in the organic photoelectric conversion layer 15, is guided toward the bottom-electrode-13 side having a relatively high potential (the hole is guided toward the top-electrode-16 side). In this manner, the electron Eg is extracted from the bottom electrode 13, and is accumulated in the electricity storage layer for green 110G (n-type region 115n, in detail) through the transmission path A. Further, the accumulation of the electron Eg also causes fluctuation of the potential VL of the bottom electrode 13 in electrically-conductive relation to the electricity storage layer for green 110G. This amount of the variation in the potential VL corresponds to a signal potential (here, a potential of a green signal).

Further, upon the reading operation, the transfer transistor Tr1 is turned into an ON state, and the electron Eg accumulated in the electricity storage layer for green 110G is transferred to the FD 116. This causes the green signal based on a light reception amount of the green light Lg to be read by the later-described vertical signal line Lsig through another unillustrated pixel transistor. Thereafter, the unillustrated reset transistor and the transfer transistor Tr1 are turned into an ON state, causing the FD 116 as the n-type region and an electricity storage region of the electricity storage layer for green 110G (n-type region 115n) to be reset to a power supply voltage VDD, for example.

(Acquisition of Blue Signal and Red Signal by Inorganic Photoelectric Conversion Sections 11B and R)

Thereafter, out of pieces of light having been transmitted through the organic photoelectric conversion section 11G, blue light and red light are absorbed in order, respectively, in the inorganic photoelectric conversion sections 11B and 11R to each undergo the photoelectric conversion. In the inorganic photoelectric conversion section 11B, an electron Eb corresponding to the entering blue light is accumulated in the n-type region (n-type photoelectric conversion layer 111n), and the accumulated electron Ed is transferred to the FD 113 upon the reading operation. It is to be noted that the hole is accumulated in the unillustrated p-type region. Likewise, in the inorganic photoelectric conversion section 11R, an electron Er corresponding to the entering red light is accumulated in the n-type region (n-type photoelectric conversion layer 112n), and the accumulated electron Er is transferred to the FD 114 upon the reading operation. It is to be noted that the hole is accumulated in the unillustrated p-type region.

As described above, in the state where the electric charge is accumulated, the negative potential VL is applied to the bottom electrode 13 of the organic photoelectric conversion section 11G. Thus, the p-type region (p-type region 111p in FIGS. 3A and 3B) being the hole accumulation layer of the inorganic photoelectric conversion section 11B tends to have an increased hole concentration. Accordingly, it becomes possible to suppress the occurrence of the dark current at the interface between the p-type region 111p and the insulating layer 12.

Upon the reading operation, similarly to the above-described organic photoelectric conversion section 11G, the transfer transistors Tr2 and Tr3 are turned into an ON state, and the electrons Eb and Er accumulated, respectively, in the n-type photoelectric conversion layers 111n and 112n are transferred, respectively, to the FDs 113 and 114. This causes each of the blue signal based on a light reception amount of blue light Lb and the red signal based on a light reception amount of red light Lr to be read by the later-described vertical signal line Lsig through another unillustrated pixel transistor. Thereafter, the unillustrated reset transistor and the transfer transistors Tr2 and Tr3 are turned into an ON state, causing the FDs 113 and 114 as the n-type regions to be reset to the power supply voltage VDD, for example.

In this manner, by stacking the organic photoelectric conversion section 11G and the inorganic photoelectric conversion sections 11B and 11R in the vertical direction, it becomes possible to separate and detect pieces of color light of red, green, and blue, without providing a color filter, thus allowing the signal electric charge of each color to be obtained. This makes it possible to suppress an optical loss (reduction in sensitivity) caused by color light absorption by the color filter as well as occurrence of a false color associated with a pixel interpolation process.

(1-3. Workings and Effects)

In recent years, there has been developed an image sensor that is able to obtain photoelectric conversion signals of three colors with a single pixel. Such an image sensor is provided with, for example, two photodiodes (inorganic photoelectric conversion sections) stacked inside a silicon substrate, and an organic photoelectric conversion film above the silicon substrate. Moreover, in a general image sensor, an optical black region (OPB region) that detects black is formed around an effective pixel region. In the OPB region, a metal film such as W is formed as a light shielding film.

Now, as described above, an organic photoelectric conversion film varies greatly in characteristics under influences of stress of a film to be formed above. The light shielding film is formed in an upper layer than the organic photoelectric conversion film. The metal film that constitutes the light shielding film generally has high stress. Accordingly, there is possibility that the organic photoelectric conversion film generates an OPB level difference under influences of the stress of the light shielding film. A possible method to reduce the stress of the light shielding film is to reduce a thickness of the light shielding film. However, because the light shielding film is expected to have light shielding properties, it is difficult to reduce the stress by thinning.

Moreover, generally, the organic photoelectric conversion film is not resistant to heat. A sealing film provided between the light shielding film and the organic photoelectric conversion film is, therefore, formed by a low-temperature process. The sealing film is provided for prevention of intrusion of, for example, moisture into the organic photoelectric conversion film. The sealing film formed by the low-temperature process, having low film quality, is formed with a large thickness, in order to ensure the sealing properties. However, a distance from the organic photoelectric conversion film and the inorganic photoelectric conversion sections to the on-chip lens becomes larger by the thickness of the sealing film, causing a concern of a lowered oblique entrance characteristic.

Meanwhile, in this embodiment, the cavity structure 17A is formed in the sealing layer 17 at a position corresponding to the effective pixel region 100A. The sealing layer 17 is provided on the organic photoelectric conversion section 11G that includes the organic photoelectric conversion layer 15. Thus, stress applied to the organic photoelectric conversion layer 15 is reduced, while allowing for closer disposition of the exit surface of the on-chip lens 21 to the light receiving surface of each of the organic photoelectric conversion section 11G and the inorganic photoelectric conversion sections 11B and 11R. Hence, in the imaging device 1 of this embodiment, it is possible to enhance the photoelectric conversion characteristic, with the improvement in the oblique entrance characteristic, while maintaining the sealing properties and the light shielding properties.

Described next are second and third embodiments and modification examples (modification examples 1 and 2) of the forgoing first embodiment. It is to be noted that constituent elements corresponding to those of the imaging device 1 of the first embodiment are denoted by the same reference characters, and description thereof is omitted.

2. Modification Example 1

FIG. 7 illustrates a cross-sectional configuration of an imaging device (imaging device 2) according to a modification example (modification example 1) of the forgoing first embodiment. FIG. 8 illustrates a cross-sectional configuration of an imaging device (imaging device 3) according to the modification example of the forgoing first embodiment. As with the forgoing first embodiment, the imaging devices 2 and 3 are each, for example, a CCD image sensor or a CMOS image sensor of the backside illumination type (backside light receiving type), and each has the configuration in which the cavity structure 17A is provided at the position corresponding to the effective pixel region 100A. The imaging device 2 is different from the forgoing first embodiment in that the high sealing layer 20 is provided on the sealing layer 17. The imaging device 3 is different from the forgoing first embodiment in that the high sealing layer 20 is provided on the top electrode 16 of the organic photoelectric conversion section 11G.

As mentioned above, the high sealing layer 20 in the imaging device 2 is provided on the sealing layer 17. The high sealing layer 20 is formed, for example, as follows. The similar processes to those of the forgoing first embodiment are carried out until the formation of the sealing layer 17. The cavity structure 17A is formed in the sealing layer 17 by etching. Thereafter, for example, a SiCO film is formed on an entire surface of the sealing layer 17. The high sealing layer 20 in the imaging device 2 is formed to be continuous over a side surface and a bottom surface of a guard ring hole 17H in the OPB region 100B. The guard ring hole 17H is formed outside the photoelectric conversion sections (the organic photoelectric conversion section 11G and the inorganic photoelectric conversion sections 11B and 11R) formed as, for example, the dummy pixels. The guard ring hole 17H is provided for suppression of intrusion of, for example, moisture through, for example, the contact hole 19H, or through a diced face of a sidewall of a chip after wafer dicing. The guard ring hole 17H is provided, for example, inwardly from the contact hole 19H, to surround the effective pixel region 100A.

The high sealing layer 20 of the imaging device 3 is provided on the top electrode 16 of the organic photoelectric conversion section 11G as mentioned above, and over an entire surface of the semiconductor substrate 11. Specifically, the high sealing layer 20 of the imaging device 3 is provided to be continuous from over the insulating layer 14 along the organic photoelectric conversion layer 15 and a side surface of the top electrode 16. The high sealing layer 20 is formed, for example, as follows. The similar processes to those of the forgoing first embodiment are carried out until the formation of the top electrode 16. Thereafter, for example, a SiCO film is formed on the entire surface of the semiconductor substrate 11.

As described, it is possible for the high sealing layer 20 to prevent moisture from intruding into the organic photoelectric conversion layer 15, regardless of its position, insofar as the high sealing layer 20 is provided above the organic photoelectric conversion layer 15.

It is to be noted that as illustrated in FIG. 8, a protective layer 22 may be provided on the top electrode 16. The protective layer 22 is, for example, a SiN film. Providing the protective layer 22 on the top electrode 16 makes it possible to absorb UV light for irradiation in a process after the formation of the top electrode 16, and to prevent, for example, damages to the organic photoelectric conversion layer 15.

3. Second Embodiment

FIG. 9 illustrates a cross-sectional configuration of an imaging device (imaging device 4) according to a second embodiment of the disclosure. As with the forgoing first embodiment, the imaging device 4 is, for example, a CCD sensor or a CMOS sensor of the backside illumination type (backside light receiving type), and has a configuration in which the cavity structure 17A is provided at the position corresponding to the effective pixel region 100A, within the sealing layer 17 provided on the organic photoelectric conversion section 11G. In the imaging device 4 of this embodiment, a sealing layer 30 that differs in etching rate from the sealing layer 17 is provided at any position in a thickness direction inside the sealing layer 17.

As mentioned above, the sealing layer 30 is provided at any position in the thickness direction inside the sealing layer 17. The sealing layer 30 is a film having a different etching rate from that of the sealing layer 17, and specifically, a film having a smaller etching rate from the etching rate of the sealing layer 17. Examples of such a film include a silicon oxide film, a silicon nitride film, and a silicon oxynitride film that have better film quality than, for example, a silicon oxide film, a silicon nitride film, and a silicon oxynitride film that constitute the sealing layer 17. Besides, examples include an AlO film, an AlN film, a SiN film, a SiON film, a SiCO film, or a SiCN film, as exemplified for the high sealing layer 20 in the forgoing first embodiment. The sealing layer 30 functions as an etching stopper film, owing to a difference in the etching rates between the sealing layers 17 and 30. Therefore, it suffices to form the sealing layer 30 at a position above the organic photoelectric conversion layer 15. A thickness of the sealing layer 30 is preferably, for example, 10 nm or more.

The imaging device 4 is formed with a similar method to that of the first embodiment, until the formation of the top electrode 16. Thereafter, a sealing layer 17a is formed by, for example, the plasma CVD method. Thereafter, the top electrode 16 and the organic photoelectric conversion layer 15 are patterned. Thereafter, the sealing layer 30 is formed on the sealing layer 17a. On the sealing layer 30, a sealing layer 17b is formed. Thus, the sealing layer 30 is formed inside the sealing layer 17. After this, the imaging device 4 is formed with the use of the similar method to that of the first embodiment. It is to be noted that in forming the cavity structure 17A, because the sealing layer 30 serves as the etching stopper film as well, the bottom surface of the cavity structure 17A is configured by the sealing layer 30. It is to be noted that in this embodiment, given is an example where the sealing layer 30 is provided over the entire surface of the semiconductor substrate 11. However, it suffices to provide the sealing layer 30 at least inside the effective pixel region 100A in which the cavity structure 17A is formed.

In this embodiment, the sealing layer 30 is provided at any position in the thickness direction inside the sealing layer 17. The sealing layer 30 has the different etching rate from that of the sealing layer 17 (specifically, the smaller etching rate than that of the sealing layer 17). This allows the sealing layer 30 to function as the etching stopper film, making it possible to suppress variations in the depth $W_1$ inside the cavity structure 17A. Hence, it is possible to produce an effect of reduction in variations in optical characteristics, in addition to the effects of the forgoing first embodiment.

4. Modification Example 2

FIG. 10 illustrates a cross-sectional configuration of an imaging device (imaging device 5) according to a modification example (modification example 2) of the forgoing second embodiment. As with the forgoing first embodiment and other example embodiments, the imaging device 5 is, for example, a CCD image sensor or a CMOS image sensor of the backside illumination type (backside light receiving type), and has a configuration in which the cavity structure 17A is provided at the position corresponding to the effective pixel region 100A. The imaging device of this modification example is a combination of the forgoing second embodiment with the imaging device 3 of the modification example 1, in which the sealing layer 30 having the different etching rate from that of the sealing layer 17 is provided on the top electrode 16 of the organic photoelectric conversion section 11G.

In this modification example, the sealing layer 30 is provided on the top electrode 16 of the organic photoelectric conversion section 11G. The silicon oxide film, the silicon nitride film, and the silicon oxynitride film that have better film quality, or the AlO film, the AlN film, the SiN film, the SiON film, the SiCO film, or the SiCN film that constitutes the sealing layer 30 have a higher function of preventing the intrusion of, for example, moisture, than the sealing layer 17. Hence, it is possible to completely eliminate the sealing layer 17 from the effective pixel region 100A, leading to further reduction in the distance from the exit surface of the on-chip lens 21 to the light receiving surface of each of the photoelectric conversion sections (the organic photoelectric conversion section 11G and the inorganic photoelectric conversion sections 11B and 11R).

It is to be noted that in the imaging device 5, as with the imaging device 3 in the forgoing modification example 1, the protective layer 22 may be formed between the top electrode 16 and the sealing layer 30.

5. Third Embodiment

FIG. 11 illustrates a cross-sectional configuration of an imaging device (imaging device 6) according to a third embodiment of the disclosure. As with the forgoing first embodiment and other example embodiments, the imaging device 6 is, for example, a CCD image sensor or a CMOS image sensor of the backside illumination type (the backside light receiving type), and has a configuration in which the cavity structure 17A is provided at the position corresponding to the effective pixel region 100A, within the sealing layer 17 provided on the organic photoelectric conversion section 11G. The imaging device 4 in this embodiment includes an indent 17B in the side surface of the cavity structure 17A.

In the imaging device 6 of this embodiment, a sealing layer 40 is provided at any position in the thickness direction inside the sealing layer 17. The sealing layer 40 has a different etching rate from that of the sealing layer 17. Specifically, the sealing layer 40 is configured by a film having a larger etching rate than the etching rate of the sealing layer 17. Thus, in forming the cavity structure 17A with the use of the wet etching method, etching advances faster at the position of the sealing layer 40 than in the surrounding sealing layer 17, resulting in formation of the indent 17B in the side surface of the cavity structure 17A. At this occasion, the sealing layer 40 is formed at a position that allows for improvement in the oblique entrance characteristic. The etching is carried out to allow the bottom surface of the cavity structure 17A to coincide with an interface between the sealing layer 17a and the sealing layer 340. Thus, as illustrated in FIG. 11, the indent 17B is formed in the side surface that is in adjacency to the bottom surface of the cavity structure 17A, causing the cavity structure 17A to have a substantially reverse tapered shape. This brings about a break in the light shielding film 18 at a position of the indent 17B, in forming the light shielding film 18 on the sealing layer 17b. Owing to the break in the light shielding film 18, film stress of the light shielding film 18 is released. Examples of the material of the sealing layer 40 include a silicon oxide film, a silicon nitride film, a silicon oxynitride film, an AlO film, an AlN film, a SiN film, a SiON film, or a SiCN film.

The imaging device 6 of this embodiment is formed with the use of a similar method to that of the second embodiment, until, for example, the formation of the sealing layer 17. Thereafter, the cavity structure 17A is formed with the use of the wet etching method. At this occasion, because the sealing layer 40 is etched faster than the sealing layer 17, the indent 17B is formed simultaneously with the cavity structure 17A. Thereafter, the light shielding film 18 is formed with the use of, for example, the sputtering method and the plasma CVD method. At this occasion, the light shielding film 18 has the break at the position of the indent 17B. Thus, the stress of the light shielding film 18 to be applied to the organic photoelectric conversion section 11G is released. Thereafter, the light shielding film 18 is patterned with the use of, for example, the photolithography method, and thereafter, the light shielding film 18 is processed with the use of the dry etching method. After this, the imaging device 6 is completed by using the similar method to that of the forgoing first embodiment.

In this embodiment, the sealing layer 40 is provided at any position in the thickness direction inside the sealing layer 17. The sealing layer 40 has the larger etching rate than that of the sealing layer 17. This causes the formation of the indent 17B in the side surface of the cavity structure 17A, causing the cavity structure 17A to have the substantially reverse tapered shape. Thus, in forming the light shielding film 18, the light shielding film 18 has the break at the position of the indent 17B. In general, the stress of the metal film that constitutes the light shielding film 18 becomes highest during film formation. Therefore, in forming the light shielding film 18, allowing the light shielding film 18 to have the break causes the release of the film stress of the light shielding film 18, making it possible to significantly reduce the stress to be applied to the organic photoelectric conversion layer 15. Hence, it is possible to enhance the photoelectric conversion characteristic even more, in addition to the effects in the forgoing first embodiment.

Moreover, the sealing layer 17 has been formed with a large thickness, in order to reduce the stress to be applied to the organic photoelectric conversion layer 15 from the light shielding film 18. However, in this embodiment, in formation of the light shielding film 18 during which the stress of the light shielding film 18 becomes highest, the light shielding film 18 has the break to release the stress. This makes it possible to reduce the thickness of the sealing layer 17. Hence, it is possible to enhance a manufacture yield.

6. Application Examples

Application Example 1

FIG. 12 illustrates an overall configuration of the imaging devices 1 to 6. The imaging devices 1 to 6 are CMOS imaging sensors. The imaging devices 1 to 6 each include, on the semiconductor substrate 11, a pixel section 1a as an imaging area, and a peripheral circuit section 130 in a peripheral region of the pixel section 1a. The peripheral circuit section 130 includes, for example, a row scanning section 131, a horizontal selection section 133, a column scanning section 134, and a system controller 132.

The pixel section 1a includes, for example, a plurality of unit pixels (pixels P) that are two-dimensionally arranged in rows and columns. To the pixels P, for example, pixel drive lines Lread (specifically, row selection lines and reset control lines) are wired on a pixel-row basis, and the vertical signal lines Lsig are wired on a pixel-column basis. The pixel drive line Lread transmits a drive signal for signal reading from the pixel. One end of the pixel drive line Lread is coupled to an output terminal corresponding to each row of the row scanning section 131.

The row scanning section 131 is configured by, for example, a shift register and an address decoder. The row scanning section 131 is, for example, a pixel drive section that drives each of the pixels P in the pixel section 1a in units of rows. Signals outputted from the respective pixels P in the pixel row selected and scanned by the row scanning section 131 are supplied to the horizontal selection section 133 via the respective vertical signal lines Lsig. The horizontal selection section 133 is configured by, for example, an amplifier and a horizontal selection switch that are provided for each vertical signal line Lsig.

The column scanning section 134 is configured by, for example, a shift register and an address decoder. The column scanning section 134 sequentially drives each of the horizontal selection switches in the horizontal selection section 133, while scanning each of the horizontal selection switches in the horizontal selection section 133. The selection and the scanning by the column scanning section 134 causes the signals of the respective pixels that are transmitted via the respective vertical signal lines Lsig to be sequentially outputted to horizontal signal lines 135, and to be transmitted to the outside of the semiconductor substrate 11 through the horizontal signal lines 135.

A circuit part including the row scanning section 131, the horizontal selection section 133, the column scanning section 134, and the horizontal signal lines 135 may be formed directly on the semiconductor substrate 11, or may be provided in an external control IC. Alternatively, the circuit part may be formed on another substrate coupled by, for example, a cable.

The system controller 132 receives, for example, a clock and data that instructs an operation mode. The clock and the data are supplied from the outside of the semiconductor substrate 11. Moreover, the system controller 132 outputs data such as internal information of the imaging device 1 (or any one of the imaging devices 2 to 6). The system controller 132 further includes a timing generator that generates various timing signals, and performs drive control of peripheral circuits such as the row scanning section 131, the horizontal selection section 133, and the column scanning section 134 on the basis of the various timing signals generated by the timing generator.

Application Example 2

The above-described imaging devices 1 to 6 are applicable to, for example, any type of electronic apparatus having an imaging function, e.g., a camera system such as a digital still camera and a video camera, and a mobile phone having the imaging function. As an example, FIG. 13 illustrates a schematic configuration of an electronic apparatus 10 (camera). This electronic apparatus 10 is, for example, a video camera that is able to photograph a still image or a moving image. The electronic apparatus 10 includes the imaging device 1 (or any one of the imaging devices 2 to 6), an optical system (optical lens) 310, a shutter unit 311, a drive section 313 that drives the imaging device 1 (or any one of the imaging devices 2 to 6) and the shutter unit 311, and a signal processing section 312.

The optical system 310 guides image light (entering light) from a subject to the pixel section 1a of the imaging device 1 (or any one of the imaging devices 2 to 6). The optical system 310 may include a plurality of optical lenses. The shutter unit 311 controls a period in which the imaging device 1 (or any one of the imaging devices 2 to 6) is irradiated with light and a period in which the imaging device 1 (or any one of the imaging devices 2 to 6) is shielded against the light. The drive section 313 controls transfer operation of the imaging device 1 (or any one of the imaging devices 2 to 6) and shutter operation of the shutter unit 311. The signal processing section 312 performs various kinds of signal processing on a signal outputted from the imaging device 1 (or any one of the imaging devices 2 to 6). An image signal Dout after the signal processing is stored in a storage medium such as memory, or outputted to a monitor, for example.

Although description has been made by giving the first to third embodiments, and the modification examples 1 and 2 as mentioned above, the contents of the disclosure are not limited to the above-mentioned example embodiments and may be modified in a variety of ways. For example, in the forgoing first embodiment, the imaging device has the configuration in which the organic photoelectric conversion section 11G that detects the green light, and the inorganic photoelectric conversion sections 11B and 11R that respectively detect the blue light and the red light are stacked. However, the contents of the disclosure are by no means limited to such a structure. In other words, an organic photoelectric conversion section may detect the red light or the blue light. An inorganic photoelectric conversion section may detect the green light.

Moreover, the number of organic photoelectric conversion sections, the number of the inorganic photoelectric conversion sections, and a ratio thereof are not limitative as well. Two or more organic photoelectric conversion sections may be provided, or color signals of a plurality of colors may be obtained only by the organic photoelectric conversion sections. Furthermore, the organic photoelectric conversion section and the inorganic photoelectric conversion section are not limited to have a vertically-stacked structure, and may be arranged side by side along a substrate surface.

Moreover, the foregoing example embodiments exemplify the configuration of the imaging device of the backside illumination type (the imaging device); however, the contents of the disclosure are also applicable to an imaging device of a front side illumination type. Further, the imaging device of the disclosure does not have to include all of the constituent elements described in the foregoing embodiments, and may include any other layer, conversely.

It is to be noted that the effects described herein are merely illustrative and non-limiting. Effects to be achieved by the disclosure may be other effects than those described above, or may further include other effects in addition to those described above.

It is to be noted that the disclosure may have the following configurations.

(1)

An imaging device including:

a semiconductor substrate including an effective pixel region in which a plurality of pixels are disposed, and a peripheral region provided around the effective pixel region;

an organic photoelectric conversion layer provided on side of the semiconductor substrate on which a light receiving surface is disposed;

a first sealing layer provided on the semiconductor substrate;

a recess provided in the first sealing layer on the effective pixel region; and a light shielding film provided on the first sealing layer on the peripheral region.

(2)

The imaging device according to (1), in which the recess includes a second sealing layer at least on a bottom surface of the recess.

(3)

The imaging device according to (2), in which the second sealing layer is formed to be continuous from the effective pixel region to the peripheral region.

(4)

The imaging device according to (2) or (3), further including a third sealing layer on the light shielding film, in which the second sealing layer is formed to be continuous from over the third sealing layer to the bottom surface of the recess, through side surfaces of the third sealing layer and the first sealing layer.

(5)

The imaging device according to any one of (2) to (4), further including:

a pad provided on an opposite surface of the semiconductor substrate to the light receiving surface; and a through hole made through to the pad from the side of the semiconductor substrate on which the light receiving surface is disposed, in which the second sealing layer is formed to be continuous from the bottom surface of the recess to a side surface of the through hole.

(6)

The imaging device according to any one of (2) to (5), in which the second sealing layer is formed between the first sealing layer and the light shielding film, and is formed to be continuous to the bottom surface of the recess through a side surface of the first sealing layer.

(7)

The imaging device according to any one of (2) to (6), further including:

first electrodes provided on side on which the semiconductor substrate is disposed with respect to the organic photoelectric conversion layer, the first electrodes being provided for respective ones of the plurality of the pixels; and a second electrode disposed in confronted relation to the first electrodes, with the organic photoelectric conversion layer in between, in which the second sealing layer is formed to be continuous from an edge surface of the semiconductor substrate to over the second electrode, through side surfaces of the organic photoelectric conversion layer and the second electrode.

(8)

The imaging device according to any one of (2) to (7), in which the second sealing layer is provided inside the first sealing layer.

(9)

The imaging device according to any one of (2) to (8), in which the second sealing layer is lower in etching rate than the first sealing layer.

(10)

The imaging device according to any one of (1) to (9), in which the recess is made through the first sealing layer.

(11)

The imaging device according to any one of (2) to (10), in which the bottom surface of the recess is formed by the second sealing layer.

(12)

The imaging device according to any one of (1) to (11), in which the first sealing layer includes a fourth sealing layer inside the first sealing layer, the fourth sealing layer being higher in etching rate than the first sealing layer.

(13)

The imaging device according to any one of (1) to (12), in which the recess includes a reverse tapered surface at least in a portion of a side surface of the recess.

(14)

The imaging device according to (12) or (13), in which the recess is formed in the first sealing layer and the fourth sealing layer, a side surface of the recess having an indent at a position of the fourth sealing layer.

(15)

The imaging device according to any one of (1) to (14), in which an inorganic photoelectric conversion section is embedded inside the semiconductor substrate.

(16)

An electronic apparatus provided with an imaging device, the imaging device including:

a semiconductor substrate including an effective pixel region in which a plurality of pixels are disposed, and a peripheral region provided around the effective pixel region;

an organic photoelectric conversion layer provided on side of the semiconductor substrate on which a light receiving surface is disposed;

a first sealing layer provided on the semiconductor substrate;

a recess provided in the first sealing layer on the effective pixel region; and a light shielding film provided on the first sealing layer on the peripheral region.

This application is based upon and claims priority from Japanese Patent Application No. 2016-071152 filed with the Japan Patent Office on Mar. 31, 2016, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a semiconductor substrate that comprises an effective pixel region which comprises a plurality of pixels, and a peripheral region around the effective pixel region;
an organic photoelectric conversion layer on a side of the semiconductor substrate which comprises a light receiving surface;
a first sealing layer on the semiconductor substrate;
a recess in the first sealing layer on the effective pixel region; and
a light shielding film, on the first sealing layer, in the peripheral region.

2. The imaging device according to claim 1, wherein the recess comprises a second sealing layer at least on a bottom surface of the recess.

3. The imaging device according to claim 2, wherein the second sealing layer is continuous from the effective pixel region to the peripheral region.

4. The imaging device according to claim 2, further comprising a third sealing layer on the light shielding film,
wherein the second sealing layer is continuous from over the third sealing layer to the bottom surface of the recess, through side surfaces of the third sealing layer and the first sealing layer.

5. The imaging device according to claim 2, further comprising:
a pad on an opposite surface of the semiconductor substrate to the light receiving surface; and
a through hole made through the pad from the side of the semiconductor substrate which comprises the light receiving surface,
wherein the second sealing layer is continuous from the bottom surface of the recess to a side surface of the through hole.

6. The imaging device according to claim 2, wherein
the second sealing layer is formed between the first sealing layer and the light shielding film, and
the second sealing layer is continuous from the bottom surface of the recess through a side surface of the first sealing layer.

7. The imaging device according to claim 2, further comprising:
a plurality of first electrodes on the side on which the semiconductor substrate is disposed with respect to the organic photoelectric conversion layer, and
wherein each first electrode of the plurality of first electrodes is associated with a respective pixel of the plurality of the pixels; and
a second electrode disposed in confronted relation to the plurality of first electrodes, wherein
the organic photoelectric conversion layer is in between the second electrode and the plurality of first electrodes, and
the second sealing layer is continuous from an edge surface of the semiconductor substrate to the second electrode, through side surfaces of the organic photoelectric conversion layer and the second electrode.

8. The imaging device according to claim 2, wherein the second sealing layer is inside the first sealing layer.

9. The imaging device according to claim 2, wherein an etching rate of the second sealing layer is lower than an etching rate of the first sealing layer.

10. The imaging device according to claim 1, wherein the recess is through the first sealing layer.

11. The imaging device according to claim 2, wherein the bottom surface of the recess is the second sealing layer.

12. The imaging device according to claim 1, wherein
the first sealing layer includes a fourth sealing layer inside the first sealing layer, and
an etching rate of the fourth sealing layer is higher than an etching rate of the first sealing layer.

13. The imaging device according to claim 1, wherein the recess includes a reverse tapered surface at least in a portion of a side surface of the recess.

14. The imaging device according to claim 12, wherein
- the recess is in the first sealing layer and the fourth sealing layer, and
- a side surface of the recess has an indent at a position of the fourth sealing layer.

15. The imaging device according to claim 1, wherein an inorganic photoelectric conversion section is embedded inside the semiconductor substrate.

16. An electronic apparatus, comprising
- an imaging device, wherein the imaging device comprises:
  - a semiconductor substrate that comprises an effective pixel region which comprises a plurality of pixels, and a peripheral region around the effective pixel region;
  - an organic photoelectric conversion layer on a side of the semiconductor substrate which comprises a light receiving surface;
  - a first sealing layer on the semiconductor substrate;
  - a recess in the first sealing layer on the effective pixel region; and
  - a light shielding film, on the first sealing layer, in the peripheral region.

* * * * *